(12) United States Patent
Lee et al.

(10) Patent No.: US 8,516,185 B2
(45) Date of Patent: *Aug. 20, 2013

(54) SYSTEM AND METHOD UTILIZING DISTRIBUTED BYTE-WISE BUFFERS ON A MEMORY MODULE

(75) Inventors: Hyun Lee, Ladera Ranch, CA (US); Jayesh R. Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 181 days.

This patent is subject to a terminal disclaimer.

(21) Appl. No.: 12/761,179

(22) Filed: Apr. 15, 2010

(65) Prior Publication Data

US 2011/0016250 A1    Jan. 20, 2011

Related U.S. Application Data

(63) Continuation-in-part of application No. 12/504,131, filed on Jul. 16, 2009.

(51) Int. Cl.
*G06F 12/00* (2006.01)
(52) U.S. Cl.
USPC .................... 711/104; 711/154; 711/E12.001
(58) Field of Classification Search
None
See application file for complete search history.

(56) References Cited

U.S. PATENT DOCUMENTS

| | | |
|---|---|---|
| 4,218,740 A | 8/1980 | Bennett et al. |
| 4,368,515 A | 1/1983 | Nielsen |
| 4,392,212 A | 7/1983 | Miyasaka et al. |
| 4,633,429 A | 12/1986 | Lewandowski et al. |
| 4,670,748 A | 6/1987 | Williams |
| 4,706,214 A | 11/1987 | Kassai |
| 4,866,603 A | 9/1989 | Chiba |
| 4,958,322 A | 9/1990 | Kosugi et al. |
| 4,961,172 A | 10/1990 | Shubat et al. |
| 4,961,204 A | 10/1990 | Tanaka et al. |
| 4,980,850 A | 12/1990 | Morgan |
| 5,247,643 A | 9/1993 | Shottan |
| 5,272,664 A | 12/1993 | Alexander et al. |

(Continued)

FOREIGN PATENT DOCUMENTS

| | | |
|---|---|---|
| EP | 1 816 570 A2 | 8/2007 |
| WO | WO 92/02879 | 2/1992 |

(Continued)

OTHER PUBLICATIONS

Written Opinion for International Application No. PCT/US2010/040826, date of mailing Oct. 24, 2011 in 6 pages.

(Continued)

*Primary Examiner* — Edward Dudek, Jr.
*Assistant Examiner* — Ralph A Verderamo, III
(74) *Attorney, Agent, or Firm* — Jamie J. Zheng, Esq.

(57) ABSTRACT

A memory system and method utilizing one or more memory modules is provided. The memory module includes a plurality of memory devices and a controller configured to receive control information from a system memory controller and to produce module control signals. The memory module further includes a plurality of circuits, for example byte-wise buffers, which are configured to selectively isolate the plurality of memory devices from the system memory controller. The circuits are operable, in response to the module control signals, to drive write data from the system memory controller to the plurality of memory devices and to merge read data from the plurality of memory devices to the system memory controller. The circuits are distributed at corresponding positions separate from one another.

19 Claims, 13 Drawing Sheets

(56) References Cited

U.S. PATENT DOCUMENTS

| | | | |
|---|---|---|---|
| 5,345,412 A | 9/1994 | Shiratsuchi | |
| 5,357,478 A | 10/1994 | Kikuda et al. | |
| 5,388,072 A | 2/1995 | Matick et al. | |
| 5,388,240 A | 2/1995 | Olderdissen et al. | |
| 5,392,252 A | 2/1995 | Rimpo et al. | |
| 5,426,753 A | 6/1995 | Moon | |
| 5,483,497 A | 1/1996 | Mochizuki et al. | |
| 5,485,589 A | 1/1996 | Kocis et al. | |
| 5,495,435 A | 2/1996 | Sugahara | |
| 5,581,498 A | 12/1996 | Ludwig et al. | |
| 5,590,071 A | 12/1996 | Kolor et al. | |
| 5,602,999 A | 2/1997 | Hyatt | |
| 5,638,534 A | 6/1997 | Mote, Jr. | |
| 5,655,153 A | 8/1997 | Sandorfi | |
| 5,699,542 A | 12/1997 | Mehta et al. | |
| 5,702,984 A | 12/1997 | Bertin et al. | |
| 5,703,826 A | 12/1997 | Hush et al. | |
| 5,745,914 A | 4/1998 | Connolly et al. | |
| 5,764,590 A | 6/1998 | Iwamoto et al. | |
| 5,784,705 A * | 7/1998 | Leung | 711/169 |
| 5,802,395 A | 9/1998 | Connolly et al. | |
| 5,805,520 A | 9/1998 | Anglada et al. | |
| 5,822,251 A | 10/1998 | Bruce et al. | |
| RE36,229 E | 6/1999 | Cady | |
| 5,909,388 A | 6/1999 | Mueller | |
| 5,926,827 A | 7/1999 | Dell et al. | |
| 5,926,839 A | 7/1999 | Katayama | |
| 5,953,215 A | 9/1999 | Karabatsos | |
| 5,958,025 A | 9/1999 | Sonobe | |
| 5,959,930 A | 9/1999 | Sakurai | |
| 5,963,464 A | 10/1999 | Dell et al. | |
| 5,966,736 A | 10/1999 | Gittinger et al. | |
| 5,974,493 A | 10/1999 | Okumura et al. | |
| 6,018,787 A | 1/2000 | Ip | |
| 6,044,032 A | 3/2000 | Li | |
| 6,070,217 A | 5/2000 | Connolly et al. | |
| 6,070,227 A | 5/2000 | Rokicki | |
| 6,097,652 A | 8/2000 | Roh | |
| 6,108,745 A | 8/2000 | Gupta et al. | |
| 6,115,278 A | 9/2000 | Deneroff et al. | |
| 6,134,638 A | 10/2000 | Olarig et al. | |
| 6,151,271 A | 11/2000 | Lee | |
| 6,154,418 A | 11/2000 | Li | |
| 6,154,419 A | 11/2000 | Shakkarwar | |
| 6,185,654 B1 | 2/2001 | Van Doren | |
| 6,209,074 B1 | 3/2001 | Dell et al. | |
| 6,226,709 B1 | 5/2001 | Goodwin et al. | |
| 6,226,736 B1 | 5/2001 | Niot | |
| 6,233,650 B1 | 5/2001 | Johnson et al. | |
| 6,247,088 B1 | 6/2001 | Seo et al. | |
| 6,317,352 B1 | 11/2001 | Halbert et al. | |
| 6,349,051 B1 | 2/2002 | Klein | |
| 6,400,637 B1 | 6/2002 | Akamatsu et al. | |
| 6,408,356 B1 | 6/2002 | Dell | |
| 6,414,868 B1 | 7/2002 | Wong et al. | |
| 6,415,374 B1 | 7/2002 | Faue et al. | |
| 6,438,062 B1 | 8/2002 | Curtis et al. | |
| 6,446,158 B1 | 9/2002 | Karabatsos | |
| 6,446,184 B2 | 9/2002 | Dell et al. | |
| 6,453,381 B1 | 9/2002 | Yuan et al. | |
| 6,470,417 B1 | 10/2002 | Kolor et al. | |
| 6,487,102 B1 | 11/2002 | Halbert et al. | |
| 6,502,161 B1 | 12/2002 | Perego et al. | |
| 6,518,794 B2 | 2/2003 | Coteus et al. | |
| 6,526,473 B1 | 2/2003 | Kim | |
| 6,530,007 B2 | 3/2003 | Olarig et al. | |
| 6,530,033 B1 | 3/2003 | Raynham et al. | |
| 6,553,450 B1 | 4/2003 | Dodd et al. | |
| 6,618,320 B2 | 9/2003 | Hasegawa et al. | |
| 6,621,496 B1 | 9/2003 | Ryan | |
| 6,625,081 B2 | 9/2003 | Roohparvar et al. | |
| 6,625,687 B1 | 9/2003 | Halbert et al. | |
| 6,636,935 B1 | 10/2003 | Ware et al. | |
| 6,646,949 B1 | 11/2003 | Ellis et al. | |
| 6,658,509 B1 | 12/2003 | Bonella et al. | |
| 6,674,684 B1 | 1/2004 | Shen | |
| 6,681,301 B1 | 1/2004 | Mehta et al. | |
| 6,683,372 B1 | 1/2004 | Wong et al. | |
| 6,697,888 B1 | 2/2004 | Halbert et al. | |
| 6,705,877 B1 | 3/2004 | Li et al. | |
| 6,717,855 B2 | 4/2004 | Underwood | |
| 6,721,843 B1 | 4/2004 | Estakhri | |
| 6,721,860 B2 | 4/2004 | Klein | |
| 6,738,880 B2 | 5/2004 | Lai et al. | |
| 6,742,098 B1 | 5/2004 | Halbert et al. | |
| 6,754,797 B2 | 6/2004 | Wu et al. | |
| 6,785,189 B2 | 8/2004 | Jacobs et al. | |
| 6,788,592 B2 | 9/2004 | Nakata et al. | |
| 6,807,125 B2 | 10/2004 | Coteus et al. | |
| 6,807,650 B2 | 10/2004 | Lamb et al. | |
| 6,813,196 B2 | 11/2004 | Park et al. | |
| 6,834,014 B2 | 12/2004 | Yoo et al. | |
| 6,854,042 B1 | 2/2005 | Karabatsos | |
| 6,880,094 B2 | 4/2005 | LaBerge | |
| 6,889,304 B2 | 5/2005 | Perego et al. | |
| 6,912,615 B2 | 6/2005 | Nicolai | |
| 6,912,628 B2 | 6/2005 | Wicki et al. | |
| 6,925,028 B2 | 8/2005 | Hosokawa et al. | |
| 6,944,694 B2 | 9/2005 | Pax | |
| 6,950,366 B1 | 9/2005 | Lapidus et al. | |
| 6,954,281 B2 | 10/2005 | Fukuda et al. | |
| 6,981,089 B2 | 12/2005 | Dodd et al. | |
| 6,982,892 B2 | 1/2006 | Lee et al. | |
| 6,982,893 B2 | 1/2006 | Jakobs | |
| 6,990,043 B2 | 1/2006 | Kuroda et al. | |
| 6,996,686 B2 | 2/2006 | Doblar et al. | |
| 7,007,130 B1 | 2/2006 | Holman | |
| 7,007,175 B2 | 2/2006 | Chang et al. | |
| 7,046,538 B2 | 5/2006 | Kinsley et al. | |
| 7,047,361 B2 | 5/2006 | Chong et al. | |
| 7,054,179 B2 | 5/2006 | Cogdill et al. | |
| 7,065,626 B2 | 6/2006 | Schumacher et al. | |
| 7,072,231 B2 | 7/2006 | Pax | |
| 7,073,041 B2 | 7/2006 | Dwyer et al. | |
| 7,078,793 B2 | 7/2006 | Ruckerbauer et al. | |
| 7,120,727 B2 | 10/2006 | Lee et al. | |
| 7,124,260 B2 | 10/2006 | LaBerge et al. | |
| 7,127,584 B1 | 10/2006 | Thompson et al. | |
| 7,130,952 B2 | 10/2006 | Nanki et al. | |
| 7,133,960 B1 | 11/2006 | Thompson et al. | |
| 7,133,972 B2 | 11/2006 | Jeddeloh | |
| 7,142,461 B2 | 11/2006 | Janzen | |
| 7,149,841 B2 | 12/2006 | LaBerge | |
| 7,167,967 B2 | 1/2007 | Bungo et al. | |
| 7,181,591 B2 | 2/2007 | Tsai | |
| 7,200,021 B2 | 4/2007 | Raghuram | |
| 7,227,910 B2 | 6/2007 | Lipka | |
| 7,266,639 B2 | 9/2007 | Raghuram | |
| 7,272,709 B2 | 9/2007 | Zitlaw et al. | |
| 7,281,079 B2 | 10/2007 | Bains et al. | |
| 7,286,436 B2 | 10/2007 | Bhakta et al. | |
| 7,289,386 B2 | 10/2007 | Bhakta et al. | |
| 7,346,750 B2 | 3/2008 | Ishikawa | |
| 7,356,639 B2 | 4/2008 | Perego et al. | |
| 7,370,238 B2 | 5/2008 | Billick et al. | |
| 7,437,591 B1 | 10/2008 | Wong | |
| 7,461,182 B2 | 12/2008 | Fukushima et al. | |
| 7,471,538 B2 | 12/2008 | Hofstra | |
| 7,532,537 B2 | 5/2009 | Solomon et al. | |
| 7,619,912 B2 | 11/2009 | Bhakta et al. | |
| 7,636,274 B2 | 12/2009 | Solomon et al. | |
| 7,864,627 B2 | 1/2011 | Bhakta et al. | |
| 7,881,150 B2 | 2/2011 | Solomon et al. | |
| 8,130,560 B1 * | 3/2012 | Rajan et al. | 365/189.03 |
| 2001/0003198 A1 | 6/2001 | Wu | |
| 2001/0050857 A1 | 12/2001 | Keeth et al. | |
| 2001/0052057 A1 | 12/2001 | Lai | |
| 2002/0088633 A1 | 7/2002 | Kong et al. | |
| 2003/0063514 A1 | 4/2003 | Faue | |
| 2003/0090359 A1 | 5/2003 | Ok | |
| 2003/0090879 A1 | 5/2003 | Doblar et al. | |
| 2003/0191995 A1 | 10/2003 | Abrosimov et al. | |
| 2003/0210575 A1 | 11/2003 | Seo et al. | |
| 2004/0000708 A1 | 1/2004 | Rapport et al. | |

| | | |
|---|---|---|
| 2004/0037158 A1 | 2/2004 | Coteus et al. |
| 2004/0201968 A1 | 10/2004 | Tafolla |
| 2005/0036378 A1 | 2/2005 | Kawaguchi et al. |
| 2005/0154820 A1 | 7/2005 | Briggs et al. |
| 2005/0281096 A1 | 12/2005 | Bhakta et al. |
| 2006/0044860 A1 | 3/2006 | Kinsley et al. |
| 2006/0117152 A1 | 6/2006 | Amidi |
| 2006/0126369 A1 | 6/2006 | Raghuram |
| 2006/0129755 A1 | 6/2006 | Raghuram |
| 2006/0179206 A1 | 8/2006 | Brittain et al. |
| 2006/0233012 A1 | 10/2006 | Sekiguchi et al. |
| 2006/0259711 A1 | 11/2006 | Oh |
| 2006/0262586 A1 | 11/2006 | Solomon et al. |
| 2006/0267172 A1 | 11/2006 | Nguyen et al. |
| 2006/0277355 A1 | 12/2006 | Ellsbury et al. |
| 2007/0058409 A1* | 3/2007 | Ruckerbauer et al. ......... 365/63 |
| 2008/0025137 A1 | 1/2008 | Rajan et al. |
| 2008/0162790 A1 | 7/2008 | Im |
| 2009/0103387 A1 | 4/2009 | Shau |
| 2010/0070690 A1 | 3/2010 | Amer et al. |
| 2010/0128507 A1 | 5/2010 | Solomon et al. |
| 2011/0016250 A1 | 1/2011 | Lee et al. |
| 2011/0016269 A1 | 1/2011 | Lee et al. |

FOREIGN PATENT DOCUMENTS

| | | |
|---|---|---|
| WO | WO 94/07242 | 3/1994 |
| WO | WO 95/04030 | 12/1995 |
| WO | WO 99/00734 | 7/1999 |
| WO | WO 02/058069 | 7/2002 |
| WO | WO02/063804 A2 | 8/2002 |
| WO | WO 03/017283 | 2/2003 |
| WO | WO 03/069484 | 8/2003 |
| WO | WO 2006/055497 | 5/2006 |

OTHER PUBLICATIONS

International Preliminary Report on Patentability for International Application No. PCT/US2010/040826, date of mailing Nov. 28, 2011 in 34 pages.
US 6832284, 12/2004, Perego et al. (withdrwan).
U.S. Appl. No. 12/504,131, filed Jul. 16, 2009; Owned by Netlist, Inc., Lee et al.
U.S. Appl. No. 12/851,339, filed Jun. 14, 2010; Owned by Netlist, Inc., Lee.
U.S. Appl. No. 12/774,632, filed May 5, 2010; Owned by Netlist, Inc., Lee et al.
U.S. Appl. No. 12/422,925, filed Apr. 13, 2009; Owned by Netlist, Inc., Lee et al.
U.S. Appl. No. 12/422,853, filed Apr. 13, 2009; Owned by Netlist, Inc., Lee et al.
U.S Appl. No. 12/954,492, filed Nov. 24, 2010; Owned by Netlist, Inc., Bhakta et al.
U.S. Appl. No. 12/955,711, filed Nov. 29, 2010; Owned by Netlist, Inc., Solomon et al.
U.S. Appl. No. 12/912;623, filed Oct. 26, 2010, Owned by Netlist, Inc., Bhakta et al.
U.S. Appl. No. 95/001,339, filed Jun. 8, 2010; Owned by Netlist, Inc.
U.S. Appl. No. 95/001,337, filed Jun. 4, 2010; Owned by Netlist, Inc.
U.S. Appl. No. 95/000,546, filed May 11, 2010; Owned by Netlist, Inc.
U.S. Appl. No. 95/001,381, filed Jun. 9, 2010; Owned by Netlist, Inc.
Request for *Inter Partes* Reexamination; Reexam U.S. Appl. No. 95/000,577 for U.S. Pat. No. 7,289,386, filed Oct. 20, 2010.
Request for *Inter Partes* Reexamination; Rexam U.S. Appl. No. 95/000,578 for U.S. Pat. No. 7,619,912, filed Oct. 20, 2010.
Request for *Inter Partes* Reexamination; Rexam U.S. Appl. No. 95/000,579 for U.S. Pat. No. 7,619,912, filed Oct. 21, 2010.
International Search Report and Written Opinion for related Application No. PCT/US2010/040826, mailed on Sep. 27, 2010, in 14 pages.
"64 & 72 Pin Zip/Simm Sram Module", JEDEC, Standard No. 21-C, www.jedec.com/download/search/4_04_01.pdf, Jun. 1997 pp. 4.4. 1-1.
"Bank Striping of Data Across Internal SDRAM Banks," IP.com, IPCOM000013697D, 2000.
"Distributed Memory Mapping," IP.com, IPCOM000014788D, 2000.
"Information Huawei or FPGA-Take Five," Electronic News, 2002, p. 24.
"Method for a high-performance DRAM address mapping mechanism," IP.com, IPCOM000008164D, 2002.
"Method for memory probing on a multiple-DIMM bus," IP.com, IPCOM000019063D, 2003.
"Method for multiple device interface testing using a single device," IP.com, IPCOM000010054D, 2002.
"Quad Band Memory (QBMA™): DDR200/266/333 devices producing DDR400/533/667" (the "QBMA Reference"), published by the QBMA Alliance, Platform Conference, San Jose, California, Jan. 23-24, 2002.
"DDR SDRAM RDIMM Features," Micron Technology, Inc., 2002.
Abali, B. "Memory Expansion Technology (MXT): Software Support and Performance," IBM J. Res. & Dev., vol. 45, No. 2, 2001, pp. 287-300.
Arlington, DL Evans. "Enhancement of Memory Card Redundant Bit Usage Via Simplified Fault Alignment Exclusion," IMB Technical Disclosure Bulletin, 1987.
Arroyo et al. "Method of executing Manufacturing ROM Code Without Removing System Roms," IP.com, IPCOM000037214D, 1989.
Barr, Michael. "Programmable Logic: What's it to Ya?," Embedded Systems Programming, Jun. 1999, pp. 75-84.
Bennayoun et al. "Input/Output Chip Select Doubler," IBM Technical Disclosure Bulletin, vol. 38, No. 4 1995, pp. 237-240.
Blum et al. "Fast Multichip Memory System With Power Select Signal," IMB Technical Disclosure Bulletin, 1979.
Carvalho, Carlos; "The Gap between Processor and Memory Speeds"; ICCA '02.
Cuppu et al. "Concurrency, Latency, or System Overhead: Which Has the Largest Impact on Uniprocessor DRAM-System Performance?," IEEE, 2001, pp. 62-71.
Cuppu et al. "High-Performance DRAMs in Workstation Environments," IEEE Transactions on Computers, vol. 50, No. 11, 2001, pp. 1133-1153.
Cuppu et al. "A Performance Coparison of Contemporary DRAM Architectures," *IEEE Proceedings of the 26th International Symposium on Computer Architectures*, May 2-4, 1999, Atlanta, Geogia, pp. 1-12.
Denneau, M. "Logic Processor for Logic Simulation Machine," IBM Technical Disclosure Bulletin, vol. 25, No. 1, 1982.
Fairchild Semiconductor. "DM74LS138 DM74LS139 Decoder/Demultiplexer," Fairchild Semiconductor Corporation, 2000.
Fitzgerald et al. "Chip Select Circuit for Multi-Chip RAM Modules," IP.com, IPCOM000044404D, 1984.
Freedman, Alan. "The Computer Glossary," The Complete Illustrated Dictionary, American Management Association, 2001.
Gray, KS. "Fet Ram Chip Double Density Scheme," IP.com, IPCOM000043942D, 1984.
Grimes et al. "Access Rate/Availability Improvement Logic for Dynamic Memories," IBM Technical Disclosure Bulletin, Oct. 1982.
Gupta et al. "Designing and Implementing a Fast Crossbar Scheduler," IEEE Micro, 1999, pp. 20-28.
Hession et al. "Chip Select Technique for Multi Chip Decoding," IP.com, IPCOM000070404D, 1985.
Hewlett-Packard. "Memory technology evolution: an overview of system memory technologies," technology brief, 7th edition. 2003.
Hoare et al. "An 88-Way Multiprocessor Within an FPGA With Customizable Instructions," Proceedings of the 18th International Parallel and Distributed Processing Symposium, 2004.
Intel Corporation, 66/100 MHz PC SDRAM 64-Bit Non-ECC/Parity 144 Pin Unbuffered SO-DIMM Specification, Revision 1.0, Feb. 1999.
Intel Corporation, PC SDRAM Registered DIMM Design Support Document, Revision 1.2, Oct. 1998.
Jacob, Bruce L.; "Synchronous DRAM Architectures, Organizations, and Alternative Technologies". University of Maryland, Dec. 10, 2002.
JEDEC "JEDEC Standard: Double Data Rate (DDR) SDRAM Specification", JESD79C Mar. 2003.

Jedec Standard No. 21-C, "PC2100 and PC1600 DDR SDRAM Registered DIMM Design Specification," Revision 1.3, Jan. 2002.
JEDEC Standard No. 21-C, 4.20.5-184 Pin. PC1600/2100 DDR SDRAM Unbuffered DIMM Design Specification, Revision 1.1, Release 11 b. Published Apr. 2003.
JEDEC Standard No. 21-C, 4.20.5-184 Pin. PC2700/PC2100/PC1600 DDR SDRAM Unbuffered SO-DIMM Reference Design Specification, Revision 1.1, Release 11b, Apr. 26, 2002.
JEDEC Standard No. 21-C, 4.20-2—168 Pin, PC133 SDRAM Registered Design Specification, Revision 1.4, Release 11a, Feb. 2002.
JEDEC Standard No. 21-C, 4.20-3—144 Pin, PC133 SDRAM Unbuffered SO-DIMM, Reference Design Specification, Revision 1.02, Release 11. Published Oct. 2003.
Jedec Standard, "Definition of the SSTV16859 2.5 V 13-Bit to 26-Bit SSTL_2 Registered Buffer for Stacked DDR DIMM Applications," JESD82-4B, May 2003.
Jin et al. "Embedded Memory in System-On-Chip Design: Architecture and Prototype Implementation," CCECE, 2003, pp. 141-146.
Jin et al. "Prototype Implementation and Evaluation of a Multibank Embedded Memory Archtecture in Programmable Logic," IEEE, 2003, pp. 13-16.
Kane et al. "Read Only Store Memory Extension," IP.com, IPCOM000082845D, 1975.
Kellog, Mark; "PC133: SDRAM Main Memory Performance Reaches New Heights"; IBM Microelectronics, 1999.
Keltcher et al.; "The AMD Opteron Processor for Multiprocessor Servers"; IEEE Computer Society.
Kirihata et al.; "A 390-mm, 16-Bank, 1-Gb DDR SDRAM with Hybrid Bitline Architecture"; IEEE Journal of Solid-State Circuits, vol. 34, No. 11, Nov. 1999.
Kornaros et al. "A Fully-Programmable Memory Management System Optimizing Queue Handling at Multi Gigabit Rates," DAC, 2003, pp. 54-59.
Lee et al. "A banked-promotion translation lookaside buffer system," Journal of Systems Architecture, vol. 47, 2002, pp. 1065-1078.
Lee et al. "An on-chip cache compression technique to reduce decompression overhead and design complexity." Journal of Systems Architecture, vol. 46, 2000, pp. 1365-1382.
Lin et al. "Designing a Modern Memory Hierarchy with Hardware Prefetching," IEEE Transactions on Computers, vol. 50, No. 11, 2001, pp. 1202-1217.
Luthra et al. "Interface Synthesis Using Memory Mapping for an FPGA Platform," Proceedings of the 21st International Conference on Computer Design, 2003.
Matick et al. "Read-Select Capability for Static Random-Access Memory," IBM Technical Disclosure Bulletin, 1985, pp. 6640-6642.
Matick, RE. "Logic and Decoder Arrangement for Controlling Spill/Wrap Boundaries of a Bit-Addressable Memory Decoder," IMB Technical Disclosure Bulletin, 1984.
Meyers et al. "Use of Partially Good Memory Chips," IP.com, IPCOM000066246D, 1979.
Miles J. Murdocca et al., "Principles of Computer Architecture", Prentice Hall, 2000, pp. 249-251.
Ofek et al. "Partial Two Way Mapping Technique," IBM Technical Disclosure Bulletin, 1969.
Paldan, David. "Programmable Memory Address Decoding for Microprocessor Memory Device," IP.com, IPCOM000005486D, 1983.
Pellinger et al. "Dual Addressable Memory," IP.com, IPCOM000068610D, 1978.
Plotnick et al. "Shuffle Your Chips for Better Performance," PC Week, 1998, p. 90.
Schubert et al. "Accelerating system integration by enhancing hardware, firmware, and co-simulation," IBM J. Res. & Dev, vol. 48, No. 3/4, May/Jul. 2004, pp. 569-581.
Skelton, MH. "Program Controlled Paging Scheme for Memory Expansion," IP.com. IPCOM000050954D, 1982.
Slegel et al. "IBM's S/390 G5 Microprocessor Design," IEEE Micro, 1999, pp. 12-23.
Smith, BA. "Chip Select Decoder Circuit," IP.com, IPCOM000063400D, 1985.
Stelzer, KC. "Planar Memory Boundary Registers with Remap Feature," IBM Technical Disclosure Bulletin, 1993.
Sunaga et al. "An Enable Signal Circuit for Multiple Small Banks," IP.com, IPCOM000015887D, 2002.
Sunaga et al. "Continuous RAS Access Method in Multiple-bank DRAM Chip," IP.com, IPCOM000123375D, 1998.
Toal et al. "A 32-Bit SoPC Implementation of a P5." Proceedings of the Eighth IEEE International Symposium on Computers and Communications, 2003, pp. 1530-1346.
Tudruj, Marek. "Dynamically reconfigurable heterogenous multiprocessor systems with transputer-controlled communication," Journal of Systems Architecture, vol. 43, 1997, pp. 27-32.
Yao, YL. High Density Memory Selection Circuit,: IP.com, IPCOM000078218D, 1972.
Kazusawa, et al. "RAS Buffering Technique to Prevent Stored Data Destruction in DRAM Standby State," dated Jan. 1, 1996, p. 341-344.
Qureshi, "High Utilization and Reliability Memory Bit Steering Method," dated Mar. 1, 1995, p. 615-616.
Takai, et al. "250 Mbyte/s Synchronous DRAM using a 3-Stage-Pipelined Architecture," IEEE Journal of Solid-State Circuits, vol. 29, No. 4, p. 426-431, dated Apr. 1994.
Ayukawa, et al., "An Access-Sequence Control Scheme to Enhance Random-Access Performance of Embedded DRAM's," IEEE Journal of Solid-State Circuits, vol. 33, No. 5, p. 800-806, dated May 1998.
Intel® 6400/6402 Advanced Memory Buffer Datasheet, published Oct. 2006.
JEDEC Standard JESD79D, "Double Data Rate (DDR) SDRAM Specification," published Jan. 2004.
JEDEC Standard No. 21-C DDR SDRAM PC2100 and PC1600 DDR SDRAM Registered DIMM Design Specification, Revision 1.3, Release 11b, Jan. 2002.
Karabatsos, C., "Quad Band Memory (QBM) Technology", Kentron Technologies, Inc., Apr. 2001, pp. 1-5.
International Search Report and Written Opinion, PCT/US2011/059209, Jan. 31, 2013.

* cited by examiner

Figure 1A: (Prior Art)
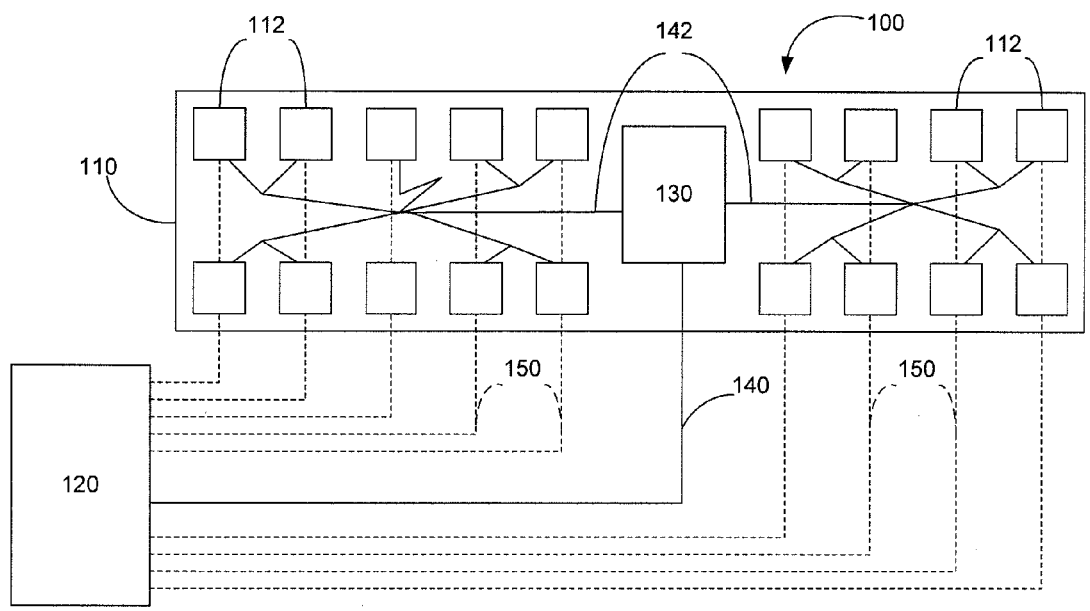

Figure 1B: (Prior Art)
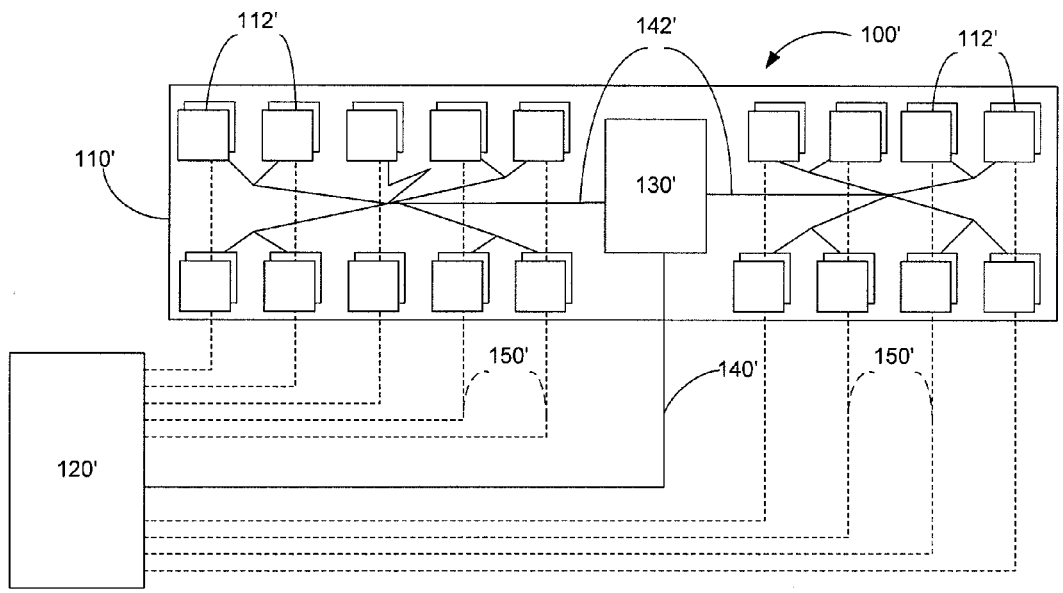

Figure 2A: (Prior Art)
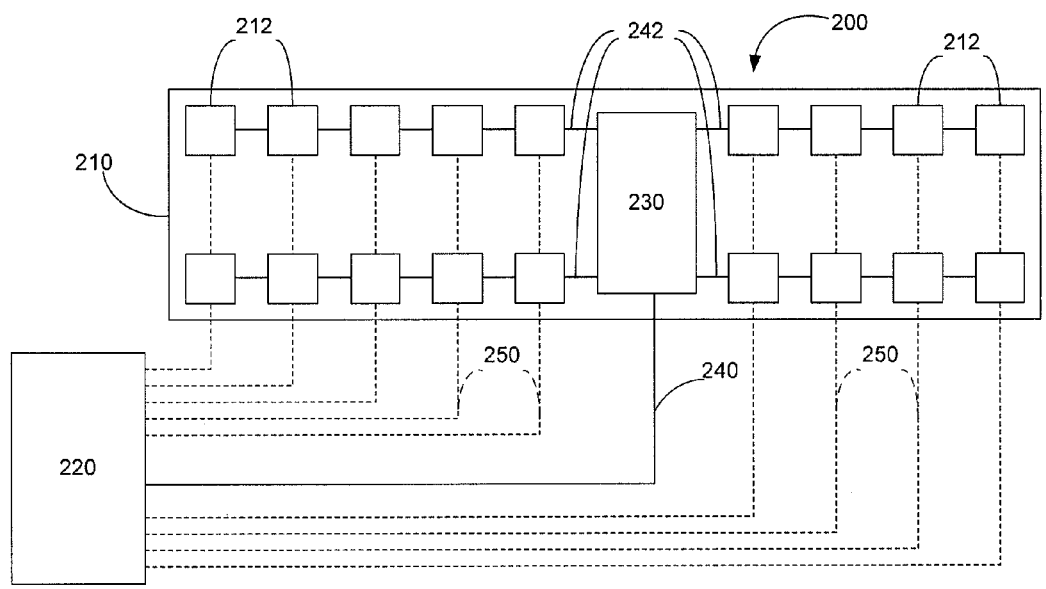

Figure 2B: (Prior Art)
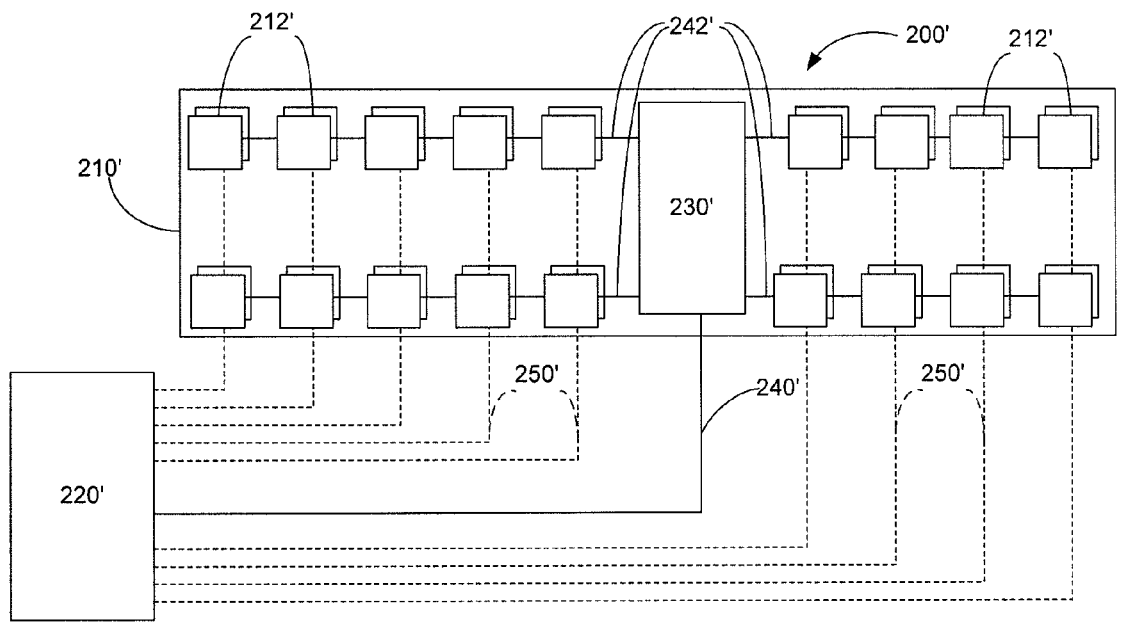

Figure 2C: (Prior Art)
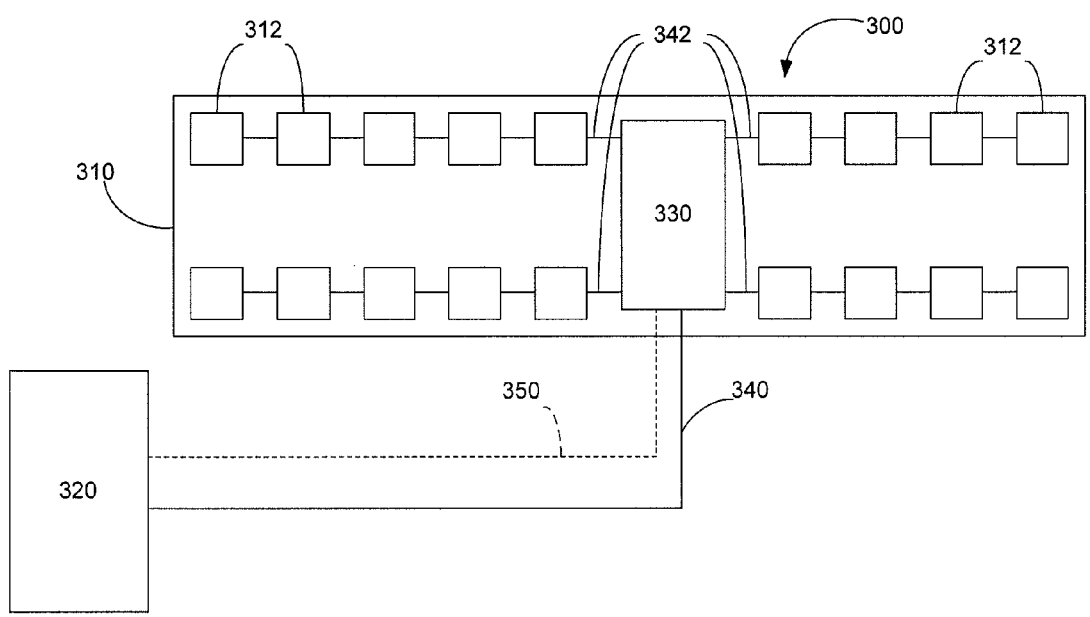

Figure 2D: (Prior Art)
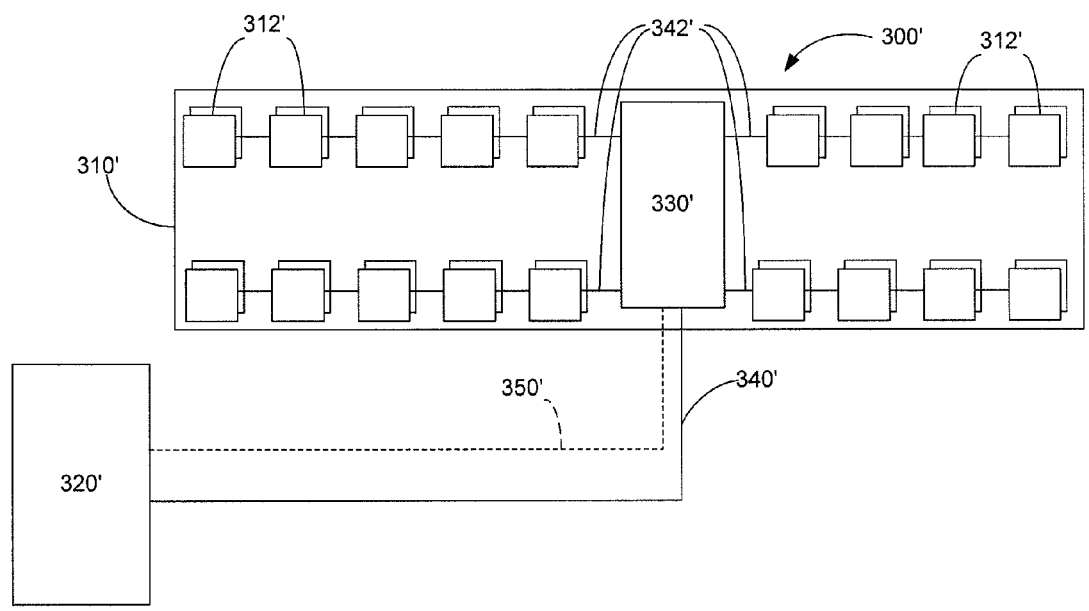

SYSTEM AND METHOD UTILIZING DISTRIBUTED BYTE-WISE BUFFERS ON A MEMORY MODULE

CROSS-REFERENCE TO RELATED APPLICATIONS

This application is a continuation-in-part from U.S. patent application Ser. No. 12/504,131, filed Jul. 16, 2009 and incorporated in its entirety by reference herein.

BACKGROUND

The present disclosure relates generally to memory subsystems of computer systems, and more specifically to systems, devices, and methods for improving the performance and the memory capacity of memory subsystems or memory "boards," particularly memory boards that include dual in-line memory modules (DIMMs).

Certain types of computer memory subsystems include a plurality of dynamic random-access memory (DRAM) or synchronous dynamic random access memory (SDRAM) devices mounted on a printed circuit board (PCB). These memory subsystems or memory "boards" are typically mounted in a memory slot or socket of a computer system, such as a server system or a personal computer, and are accessed by the processor of the computer system. Memory boards typically include one or more memory modules, each with a plurality of memory devices (such as DRAMs or SDRAMs) in a unique configuration of rows, columns, and banks, which provide a total memory capacity for the memory module.

The memory devices of a memory module are generally arranged as ranks or rows of memory, each rank of memory generally having a bit width. For example, a memory module in which each rank of the memory module is 64 bits wide is described as having an "×64" or "by 64" organization. Similarly, a memory module having 72-bit-wide ranks is described as having an "×72" or "by 72" organization.

The memory capacity of a memory module increases with the number of memory devices. The number of memory devices of a memory module can be increased by increasing the number of memory devices per rank or by increasing the number of ranks. Rather than referring to the memory capacity of the memory module, in certain circumstances, the memory density of the memory module is referred to instead.

During operation, the ranks of a memory module are selected or activated by control signals that are received from the processor. Examples of such control signals include, but are not limited to, rank-select signals, also called chip-select signals. Most computer and server systems support a limited number of ranks per memory module, which limits the memory density that can be incorporated in each memory module.

The memory space in an electronic system is limited by the physically addressable space that is defined by the number of address bits, or by the number of chips selected. In general, once the memory space is defined for an electronic system, it would not be feasible to modify the memory space without an extensive design change. This is especially true for the case in which a memory space is defined by a consortium, such as the Joint Electron Device Engineering Council (JEDEC). A problem arises when a user's application requires a larger addressable memory space than the memory space that the current electronic system is designed to support.

In developing a memory subsystem, consideration is always given to memory density, power dissipation (or thermal dissipation), speed, and cost. Generally, these attributes are not orthogonal to each other, meaning that optimizing one attribute may detrimentally affect another attribute. For example, increasing memory density typically causes higher power dissipation, slower operational speed, and higher costs.

Furthermore, the specifications of the memory subsystem may be guided by physical limitations associated with these attributes. For example, high thermal dissipation may limit the speed of the operation, or the physical size of the memory module may limit the density of the module.

These attributes generally dictate the design parameters of the memory module, usually requiring that the memory system slow down operation speed if the memory subsystem is populated with more memory devices to provide higher density memory cards.

SUMMARY

In certain embodiments, a memory module is provided. The memory module comprises at least one printed circuit board and a plurality of memory devices mechanically coupled to the at least one printed circuit board. The memory module further comprises a control circuit mechanically coupled to the at least one printed circuit board. The control circuit is configurable to receive control signals from a system memory controller and to transmit module control signals to the plurality of memory devices. The memory module further comprises a plurality of data transmission circuits mechanically coupled to the at least one printed circuit board and distributed at corresponding positions relative to the at least one printed circuit board. The plurality of data transmission circuits is configurable to be operatively coupled to the system memory controller and configurable to receive module control signals from the control circuit. At least one first data transmission circuit of the plurality of data transmission circuits is operatively coupled to at least two memory devices of the plurality of memory devices. At least one second data transmission circuit of the plurality of data transmission circuits is operatively coupled to at least two memory devices of the plurality of memory devices. The at least one first data transmission circuit is configurable to respond to the module control signals by selectively allowing or inhibiting data transmission between the system memory controller and at least one selected memory device of the at least two memory devices operatively coupled to the at least one first data transmission circuit. The at least one second data transmission circuit is configurable to respond to the module control signals by selectively allowing or inhibiting data transmission between the system memory controller and at least one selected memory device of the at least two memory devices operatively coupled to the at least one second data transmission circuit.

In certain embodiments, a memory module is provided. The memory module comprises a plurality of memory devices and a controller configured to receive control information from a system memory controller and to produce module control signals. The memory module further comprises a plurality of circuits configured to selectively isolate the plurality of memory devices from the system memory controller. The circuits are operable, in response to the module control signals, to drive write data from the system memory controller to the plurality of memory devices and to merge read data from the plurality of memory devices to the system memory controller. The circuits are distributed at corresponding positions separate from one another.

In certain embodiments, a method of operating a memory module comprising a plurality of memory devices is provided. The method comprises providing a data transmission circuit on a data line between a computer system memory controller and the plurality of memory devices of the memory module. The data transmission circuit comprises a byte-wise buffer. The method further comprises, during a write operation, enabling the data transmission circuit to drive a data signal from the computer system memory controller on one of a plurality of paths to the memory devices of the memory module. The method further comprises, during a read operation, enabling the data transmission circuit to merge a plurality of data signals from the memory devices of the memory module and driving the merged data signal to the computer system memory controller.

BRIEF DESCRIPTION OF THE DRAWINGS

A complete understanding of the present invention may be obtained by reference to the accompanying drawings, when considered in conjunction with the subsequent, detailed description, in which:

FIG. 1A is a schematic representation of a conventional memory subsystem populated with at least one JEDEC-standard two-rank memory module;

FIG. 1B is a schematic representation of a conventional memory subsystem populated with at least one JEDEC-standard four-rank memory module.

FIG. 2A is a schematic representation of another conventional memory subsystem populated with at least one two-rank memory module.

FIG. 2B is a schematic representation of another conventional memory subsystem populated with at least one four-rank memory module.

FIGS. 2C and 2D schematically illustrate a conventional two-rank memory module and a four-rank memory module, respectively, each comprising a memory buffer.

For purposes of clarity and brevity, like elements and components bear like designations and numbering throughout the figures.

DETAILED DESCRIPTION

Figure 3A:
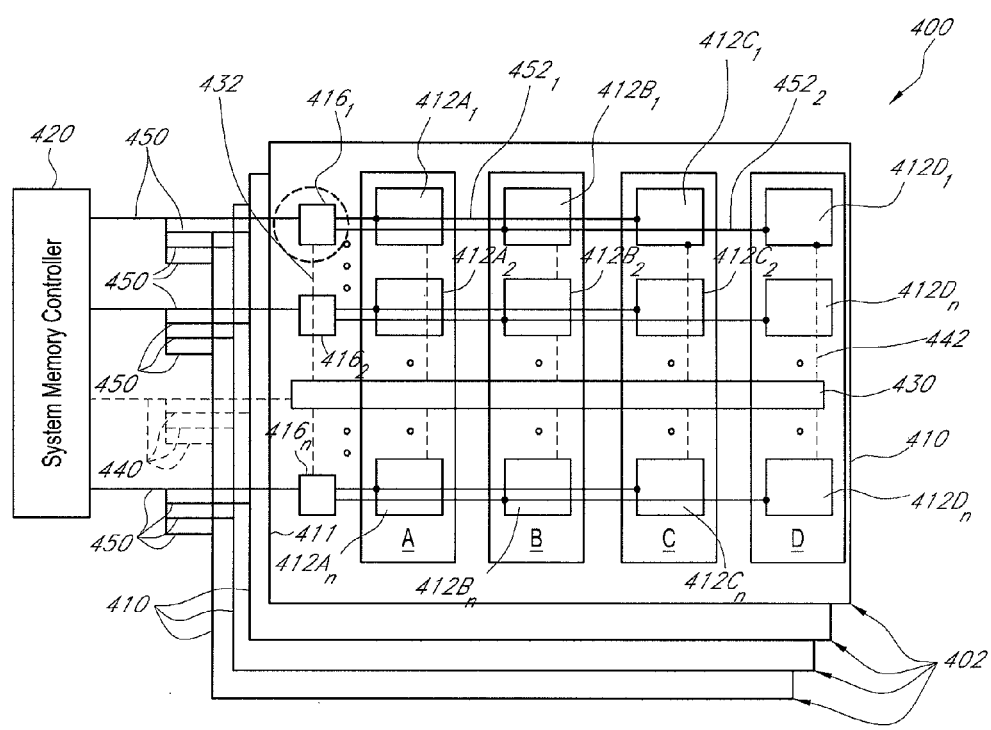
FIG. 3A is a schematic representation of an example memory subsystem in accordance with an embodiment of the disclosure.

One method for increasing memory space is based on an address decoding scheme. This method is very widely adopted in the electronics industry in designing Application-Specific Integrated Circuit (ASIC) and System-On-Chip (SOC) devices to expand system memories. Another method increases the addressable memory space without extensive alteration of the software or hardware of an existing electronics system. This method combines chip-select signals with an address signal to increase the number of physically addressable memory spaces (e.g., by a factor of 2, by a factor of 4, by a factor of 8, or by other factors as well).

These methods have several shortcomings. For example, since these methods increase the addressable memory space by directly adding memory chips, a heavier load is presented to the outputs of the system controller and the outputs of the memory devices, resulting in a slower system. Also, increasing the number of memory devices results in higher power dissipation. In addition, since an increase in the number of memory devices on each memory module alters the physical properties of the memory module while the system board remains the same, the overall signal (transmission line) wave characteristics deviate from the original design intent or specification. Furthermore, especially when registered DIMMs (RDIMMs) are used, the increase in the number of the memory devices translates to an increase in the distributed RC load on the data paths, but not on the control paths (e.g., address paths), thereby introducing uneven signal propagation delay between the data signal paths and control signal paths. As used herein, the terms "control lines" and "control paths" include address lines or paths and command lines or paths, and the term "control signals" includes address signals and command signals.

FIGS. 1A and 1B illustrate a prior art approach of increasing the number of memory devices. Specifically, FIG. 1A shows a conventional memory subsystem 100 with at least one JEDEC-standard two-rank memory module 110, such as a registered dual in-line memory module (RDIMM), only one of which is shown for clarity. Each rank of the memory module 110 comprises a plurality of memory devices 112, such as dynamic random access memory (DRAM) devices or synchronous DRAM (SDRAM) devices. A register 130 receives a plurality of control lines 140 (shown as a single solid line) from the system memory controller 120 and is connected via control lines 142 to the memory devices 112 of each rank of the memory module 110. This memory subsystem 100 connects each data line of an array of data lines 150 (shown as dashed lines) from a system memory controller 120 to corresponding memory devices 112 in the two ranks in each memory module 110. Therefore, during a write operation, the system memory controller 120 sees all the memory devices 112 as its load via the data lines 150, and during a read operation, each memory device 112 sees multiple other memory devices 112, as well as the system memory controller 120, as its load via the data lines 150.

FIG. 1B is a schematic view of another conventional memory subsystem 100' with at least one JEDEC-standard four-rank memory module 110' (only one of which is shown for clarity), each rank comprising a plurality of memory devices 112'. The register 130' receives the plurality of control lines 140' (shown as a single solid line) from the system memory controller 120' and is connected via control lines 142' to the memory devices 112' of each rank of the memory module 110'. Each data line of the array of data lines 150' (shown as dashed lines) from the system memory controller 120' is connected (e.g., by four fanouts) to corresponding memory devices 112' in the four ranks in each memory module 110'. Therefore, as with the two-rank memory module 110 shown in FIG. 1A, during a write operation, the system memory controller 120' sees all the memory devices 112' as its load via the data lines 150', and during a read operation, each memory device 112' sees multiple other memory devices 112' and the system memory controller 120' as its load via the data lines 150'.

For both the conventional two-rank memory module 110 and the conventional four-rank memory module 110', the multiple loads seen by the memory controller 120, 120' during write operations and the multiple loads seen by the memory devices 112, 112' during read operations cause significant performance issues. For example, for synchronous operation, time delays of the various signals are desired to be substantially equal to one another such that the operation of the memory module 110, 110' is synchronized with the system bus of the computer system. Thus, the trace lengths of the memory module 110, 110' are selected such that the signals are at the same clock phase. For example, the lengths of the control lines 142, 142' from the register 130, 130' to each of the memory devices 112, 112' are substantially equal to one another. However, for faster clock speeds, small errors in the trace lengths make such synchronous operation difficult or impossible. Therefore, these prior art techniques not only reduce the speed of the memory systems, but they also require hardware modifications to minimize any deviation of the transmission line wave characteristics from the original design specification.

FIGS. 2A and 2B illustrate another prior art approach of increasing the number of memory devices. Specifically, FIG. 2A shows a conventional memory subsystem 200 with at least one two-rank memory module 210, only one of which is shown for clarity. Each rank of the memory module 210 comprises a plurality of memory devices 212, such as dynamic random access memory (DRAM) devices or synchronous DRAM (SDRAM) devices. A register 230 receives a plurality of control lines 240 (shown as a single solid line) from the system memory controller 220 and is connected via control lines 242 to the memory devices 212 of each rank of the memory module 210. This memory subsystem 200 connects each data line of an array of data lines 250 (shown as dashed lines) from a system memory controller 220 to corresponding memory devices 212 in the two ranks in each memory module 210. Therefore, during a write operation, the system memory controller 220 sees all the memory devices 212 as its load via the data lines 250, and during a read operation, each memory device 212 sees multiple other memory devices 212, as well as the system memory controller 220, as its load via the data lines 250.

FIG. 2B is a schematic view of another conventional memory subsystem 200' with at least one four-rank memory module 210' (only one of which is shown for clarity), each rank comprising a plurality of memory devices 212'. The register 230' receives the plurality of control lines 240' (shown as a single solid line) from the system memory controller 220' and is connected via control lines 242' to the memory devices 212' of each rank of the memory module 210'. Each data line of the array of data lines 250' (shown as dashed lines) from the system memory controller 220' is connected (e.g., by four fanouts) to corresponding memory devices 212' in the four ranks in each memory module 210'. Therefore, as with the two-rank memory module 210 shown in FIG. 2A, during a write operation, the system memory controller 220' sees all the memory devices 212' as its load via the data lines 250', and during a read operation, each memory device 212' sees multiple other memory devices 212' and the system memory controller 220' as its load via the data lines 250'.

For the memory modules 210, 210', the control lines 242, 242' have a "fly-by" configuration. In such a configuration, control signals are sent along the control lines 242, 242' (e.g., in a single-path daisy-chain) from the register 230, 230' to the memory devices 212, 212' of a given rank. These control signals reach each memory device 212, 212' of the rank sequentially, with the control signals first reaching the memory device 212, 212' having the shortest control line 242, 242', then reaching the memory device 212, 212' having the next-shortest control line 242, 242', and so on. For example, a control signal may reach the memory device 212, 212' having the longest control line 242, 242' a significant period of time after the same control signal reaches the memory device 212, 212' having the shortest control line 242, 242'. For synchronous operation, the memory subsystems 200, 200' have the data lines 250, 250' configured so that the time delays of the various data signals between the memory controller 220, 220' and the particular memory devices 212, 212' are substantially tailored such that the data signals and the control signals reach the particular memory device 212, 212' so that operation of the memory module 210, 210' is synchronized with the system bus of the computer system. Such "fly-by" configurations have been described as operating in "local sync" while having "global async."

For such "fly-by" configurations, the memory controller 220, 220' of FIGS. 2A and 2B is more complicated than the memory controller 120, 120' of FIGS. 1A and 1B in that the memory controller 220, 220' accounts for the time delays between the various memory devices 212, 212' and adjusts the timing of these signals appropriately for synchronous operation. However, in some situations, the clock cycle time is approximately equal to or less than the time difference (e.g., about 900 picoseconds) between the control signals reaching the memory device 212, 212' having the longest control line 242, 242' and reaching the memory device 212, 212' having the shortest control line 242, 242'. Under such situations, synchronous operation is not achievable. Thus, the time difference between the control signals reaching the memory devices 212, 212' at the extremes of the control lines 242, 242' provide a limit to the clock speed with which the memory module 210, 210' may be operated. These time differences, which can be more than one clock cycle, will limit the operational speed and performance of the memory module. In addition, as with the memory subsystems 100, 100' of FIGS. 1A and 1B, the "fly-by" memory subsystems 200, 200' of FIGS. 2A and 2B suffer from large loads which result in slower clock speeds.

One recent suggestion for the "fly-by" configurations is to provide a memory buffer which handles both the control signals and the data signals. FIGS. 2C and 2D schematically illustrate a conventional two-rank memory module 310 and a four-rank memory module 310', respectively, each comprising a memory buffer 330, 330'. The control lines 340, 340' provide conduits for control signals from the memory controller 320, 320' to the memory buffer 330, 330', and the control lines 342, 342' provide conduits for control signals from the memory buffer 330, 330' to the memory devices 312, 312'. The plurality of data lines 350, 350' (shown as one dashed line for clarity) provide conduits for data signals from the memory controller 320, 320' to the memory buffer 330, 330', and data lines (not shown for clarity) on the memory module 310, 310' provide conduits for data signals from the memory controller 320, 320' to the memory devices 312, 312'.

The configurations of FIGS. 2C and 2D seek to have both the data signals and the control signals going to the memory buffer 330, 330'. However, such configurations have significant drawbacks. To send the data signals to the various memory devices 312, 312', the memory module 310, 310' includes an extremely large number of data lines (not shown for clarity) coupling the memory buffer 330, 330' to the memory devices 312, 312'. For example, in certain circumstances, the memory buffer 330, 330' for an LRDIMM is a 628-pin device, which is extremely large. In addition, the logistics of tailoring the time delays of these many data lines is complicated or difficult to provide the desired timing of data signals from the memory buffer 330, 330' to the memory devices 312, 312'. Also, the memory module 310, 310' utilizes significant modifications of the memory controller 320, 320' since the memory buffer 330, 330' is taking over some of the control of data signal timing that conventional memory controllers have. Even so, the memory modules 310, 310' of FIGS. 2C and 2D can only operate in asynchronous mode, not synchronous mode, due to the long fly-by times as compared to the desired clock frequencies. For example, for a fly-by delay of 1 nanosecond, if the data rate is 1 Gb/second, there is the possibility of collisions on the data lines during read/write turnaround. To combat such collisions, the data rate can be slowed down or "dead" cycles can be inserted. The memory module 310, 310', as a single unit, cannot be operated in synchronous mode, but operates as locally synchronous, globally (DIMM level) asynchronous.

Figure 3B:
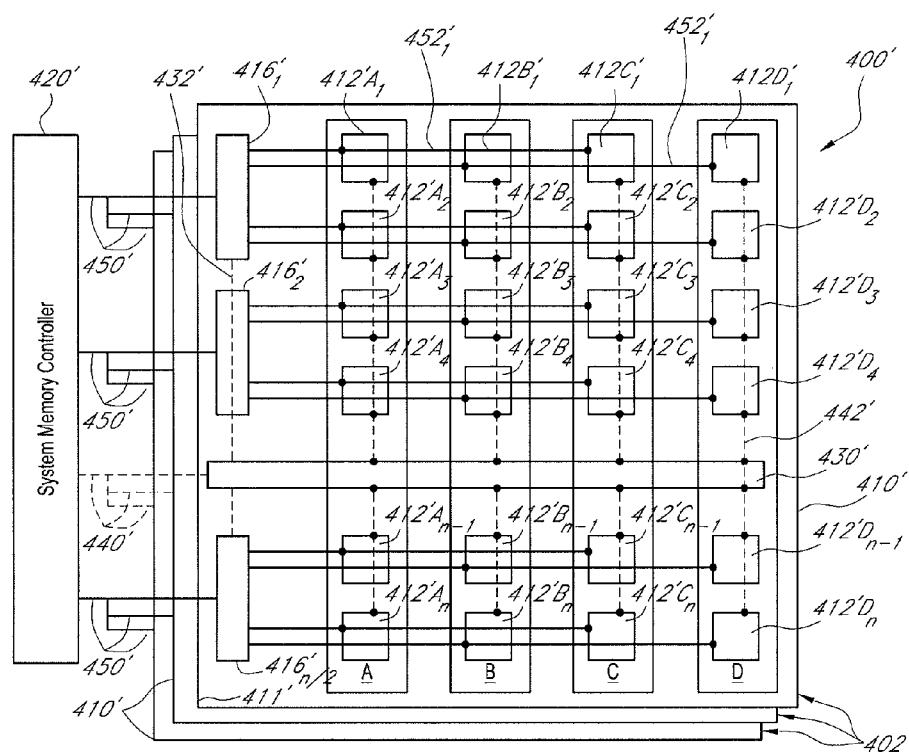
FIG. 3B schematically illustrates another example memory subsystem in accordance with certain embodiments described herein.
Figure 3C:
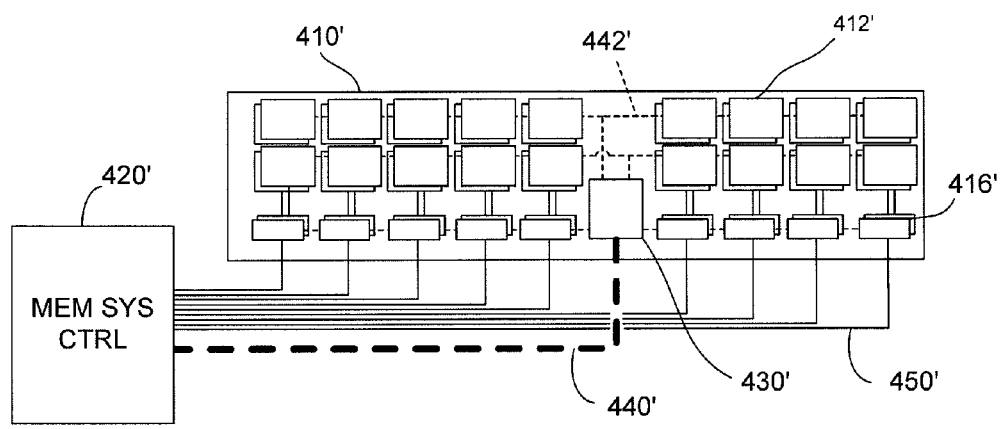
FIG. 3C schematically illustrates an example layout of the memory devices, the data transmission circuits, and the control circuit of a memory module in accordance with certain embodiments described herein.
Figure 3D:
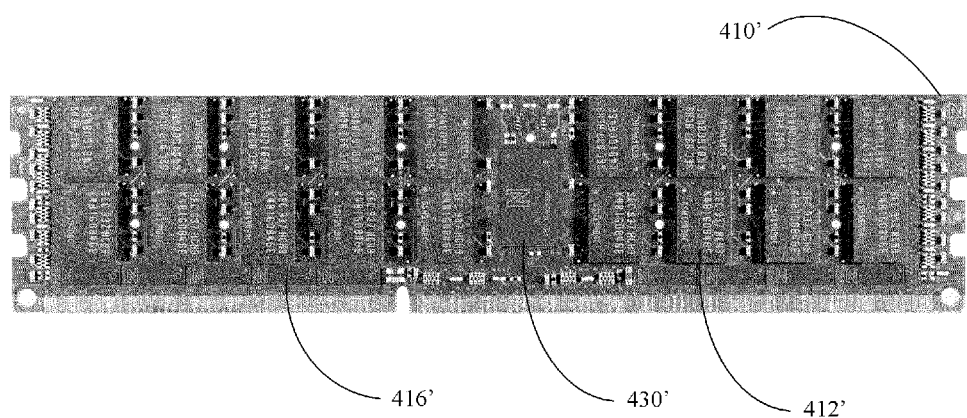
FIG. 3D is a photograph of an example memory subsystem in accordance with certain embodiments described herein.

FIG. 3A schematically illustrates an example memory subsystem 400 with load-reduced memory modules 402 in accordance with certain embodiments described herein. FIG. 3B schematically illustrates another example memory subsystem 400' with load-reduced memory modules 402' in accordance with certain embodiments described herein. FIG. 3C schematically illustrates an example layout of the memory devices 412', the data transmission circuits 416', and the control circuit 430' of a memory module 402' in accordance with certain embodiments described herein. FIG. 3D is a photograph of an example memory subsystem in accordance with certain embodiments described herein. In FIGS. 3A-3C, control lines (e.g., address and control lines 440, 440' coupling the system memory controller 420, 420' to the memory modules 410, 410') are shown as dashed lines, data lines (e.g., data lines 450, 450' coupling the system memory controller 420, 420' to the memory modules 410, 410') are shown as solid lines, and in FIGS. 3A and 3B, input/output connections are shown as black dots. In certain embodiments, as schematically illustrated by FIGS. 3A-3C, the address and control lines 440, 440' coupling the system memory controller 420, 420' to the memory module 410, 410' (e.g., to the control circuit 430, 430') are separate from the data lines 450, 450' coupling the system memory controller 420, 420' to the memory module 410, 410' (e.g., to the data transmission circuits 416, 416'). In certain embodiments, the memory subsystem 400, 400' is designed, for example, to deliver higher speed and higher memory density with lower thermal dissipation as compared with conventional memory subsystems. In the following discussion, aspects of the example subsystem 400 and corresponding components (e.g., memory modules 402, memory devices 412A, 412B, 412C, 412D, data transmission circuits 416, control circuit 430) and of the example subsystem 400' and corresponding components (e.g., memory modules 402', memory devices 412'A$_1$, 412'A$_2$, 412'B$_1$, 412'B$_2$, 412'C$_1$, 412'C$_2$, 412'D$_1$, 412'D$_2$, data transmission circuits 416', control circuit 430') should be understood to apply to certain other embodiments as well.

As schematically illustrated in FIGS. 3A and 3B, the example memory module 402, 402' comprises at least one printed circuit board 410, 410' and a plurality of memory devices 412, 412' mechanically coupled to the at least one printed circuit board 410, 410'. The memory module 402, 402' further comprises a control circuit 430, 430' mechanically coupled to the at least one printed circuit board 410, 410'. The control circuit 430, 430' is configurable to receive control signals from the system memory controller 420, 420' and to transmit module control signals to the plurality of memory devices 412, 412'. The memory module 402, 402' further comprises a plurality of data transmission circuits 416, 416' mechanically coupled to the at least one printed circuit board 410, 410' and distributed at corresponding positions relative to the at least one printed circuit board 410, 410'. The plurality of data transmission circuits 416, 416' is configurable to be operatively coupled to the system memory controller 420, 420' and configurable to receive module control signals from the control circuit 430, 430'. At least one first data transmission circuit of the plurality of data transmission circuits 416, 416' is operatively coupled to at least two memory devices of the plurality of memory devices 412, 412'. At least one second data transmission circuit of the plurality of data transmission circuits 416, 416' is operatively coupled to at least two memory devices of the plurality of memory devices 412, 412'. The at least one first data transmission circuit is configurable to respond to the module control signals by selectively allowing or inhibiting data transmission between the system memory controller 420, 420' and at least one selected memory device of the at least two memory devices operatively coupled to the at least one first data transmission circuit. The at least one second data transmission circuit is configurable to respond to the module control signals by selectively allowing or inhibiting data transmission between the system memory controller 420, 420' and at least one selected memory device of the at least two memory devices operatively coupled to the at least one second data transmission circuit.

As shown in FIGS. 3A and 3B, the memory subsystem 400, 400' is configurable to be operationally coupled to a system memory controller 420, 420', of a type well-known in the art (e.g., Intel Nehalem EP, EX chipsets; AMD Opteron chipset). The memory subsystem 400, 400' typically comprises one or more memory modules 402, 402', such as DIMMs or RDIMMs, additional details of which are shown only for one for clarity. Various types of memory modules 402, 402' are compatible with embodiments described herein. For example, memory modules having memory capacities of 512 MB, 1 GB, 2 GB, 4 GB, 8 GB, as well as other capacities, are compatible with embodiments described herein. In addition, memory modules having widths of 4 bytes, 8 bytes, 9 bytes, 16 bytes, 32 bytes, or 32bits, 64 bits, 72 bits, 128 bits, 256 bits, as well as other widths (in bytes or in bits), are compatible with embodiments described herein. Furthermore, memory modules 402, 402' compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), fully-buffered DIMMs (FBDIMMs), mini-DIMMs, and micro-DIMMs.

The one or more memory modules 402, 402' comprise one or more printed circuit boards (PCBs) 410, 410', which may be arranged in a vertical stack (as shown), or in a back-to-back array. Each memory module 402, 402' in certain embodiments comprises a single PCB 410, 410', while in certain other embodiments, each of one or more of the memory modules 402 comprises multiple PCBs 410, 410'. In some embodiments, the PCBs 410, 410' are mountable in module slots (not shown) of the computer system. A PCB 410, 410' of certain such embodiments has at least one edge connector (not shown) comprising a plurality of electrical contacts which are positioned on an edge of the PCB 410, 410' and are configured to be releasably coupled to corresponding contacts of a computer system socket to provide electrical conductivity between the system memory controller 420, 420' and the various components of the memory modules 402, 401' on the PCBs 410, 410'.

At least one memory module 402, 402' comprises a plurality of memory devices 412, 412' (such as DRAMs or SDRAMs). The memory devices 412, 412' of the memory module 402, 402' may advantageously be arranged in a plurality of rows or ranks. Memory devices 412, 412' compatible with embodiments described herein include, but are not limited to, random-access memory (RAM), dynamic random-access memory (DRAM), synchronous DRAM (SDRAM), and double-data-rate DRAM (e.g., DDR, DDR2, DDR3, etc.). In addition, memory devices 412, 412' having bit widths of 4, 8, 16, 32, as well as other bit widths, are compatible with embodiments described herein. Memory devices 412, 412' compatible with embodiments described herein have packaging which include, but are not limited to, thin small-outline package (TSOP), ball-grid-array (BGA), fine-pitch BGA (FBGA), micro-BGA (µBGA), mini-BGA (mBGA), and chip-scale packaging (CSP).

In certain embodiments, the memory devices 412, 412' of the memory module 402, 402' are arranged in four ranks, although embodiments with less than four ranks (e.g., one rank, two ranks, three ranks) or more than four ranks (e.g., 6 ranks, 8 ranks) per memory module 402, 402' may be employed. In certain embodiments, each rank comprises eight or nine memory modules, while in certain other embodiments, other numbers of memory modules per rank may also be used. In certain embodiments, as schematically shown in FIG. 3A, the memory devices 412 are arranged in four ranks, denoted A, B, C, and D, and each rank comprises n memory devices. For the sake of this disclosure, in the example memory subsystem 400 of FIG. 3A, rank A comprises memory devices $412A_1, 412A_2, \ldots, 412A_n$; rank B comprises memory devices $412B_1, 412B_2, \ldots, 412B_n$; rank C comprises memory devices $412C_1, 412C_2, \ldots, 412C_n$; and rank D comprises memory devices $412D_1, 412D_2, \ldots, 412D_n$. For the sake of this disclosure, in the example memory subsystem 400' of FIG. 3B, rank A comprises memory devices $412'A_1, 412'A_2, \ldots, 412'A_n$; rank B comprises memory devices $412'B_1, 412'B_2, \ldots, 412'B_n$; rank C comprises memory devices $412'C_1, 412'C_2, \ldots, 412'C_n$; and rank D comprises memory devices $412'D_1, 412'D_2, \ldots, 412'D_n$.

In certain embodiments, at least one memory module 402, 402' comprises one or more electrical components (not shown) which may be mounted on the PCB 410, 410', within the PCB 410, 410', or both on and within the PCB 410, 410', and are operationally coupled to one another and to the plurality of memory devices 412, 412'. For example, the electrical components may be surface-mounted, through-hole mounted, embedded or buried between layers of the PCB 410, 410', or otherwise connected to the PCB 410, 410'. These electrical components may include, but are not limited to, electrical conduits, resistors, capacitors, inductors, transistors, buffers, registers, logic elements, or other circuit elements. In certain embodiments, at least some of these electrical components are discrete, while in other certain embodiments, at least some of these electrical components are constituents of one or more integrated circuits.

In certain embodiments, at least one memory module 402, 402' comprises a control circuit 430, 430' configured to be operatively coupled to the system memory controller 420, 420' and to the memory devices 412, 412' of the memory module 402, 402' (e.g., via lines 442, 442'). In certain embodiments, the control circuit 430, 430' may include one or more functional devices, such as a programmable-logic device (PLD), an application-specific integrated circuit (ASIC), a field-programmable gate array (FPGA), a custom-designed semiconductor device, or a complex programmable-logic device (CPLD). In certain embodiments, the control circuit 430, 430' may comprise one or more custom devices. In certain embodiments, the control circuit 430, 430' may comprise various discrete electrical elements; while in other embodiments, the control circuit 430, 430' may comprise one or more integrated circuits.

The control circuit 430, 430' of certain embodiments is configurable to be operatively coupled to control lines 440, 440' to receive control signals (e.g., bank address signals, row address signals, column address signals, address strobe signals, and rank-address or chip-select signals) from the system memory controller 420, 420'. The control circuit 430, 430' of certain embodiments registers signals from the control lines 440, 440' in a manner functionally comparable to the address register of a conventional RDIMM. The registered control lines 440, 440' are also operatively coupled to the memory devices 412, 412'. Additionally, the control circuit 430, 430' supplies control signals for the data transmission circuits 416, 416' (e.g., via lines 432, 432'), as described more fully below. The control signals indicate, for example, the direction of data flow, that is, to or from the memory devices 412, 412'. The control circuit 430, 430' may produce additional chip-select signals or output enable signals based on address decoding. Examples of circuits which can serve as the control circuit 430, 430' are described in more detail by U.S. Pat. Nos. 7,289,386 and 7,532,537, each of which is incorporated in its entirety by reference herein.

In certain embodiments, at least one memory module 402, 402' comprises a plurality of data transmission circuits 416, 416' mounted on the one or more PCBs 410, 410', within the one or more PCBs 410, 410', or both on and within the one or more PCBs 410, 410'. The plurality of data transmission circuits 416, 416' are operatively coupled to the control circuit 430, 430' (e.g., via lines 432, 432'), and configured to be operatively coupled to the system memory controller 420, 420' (e.g., via the data lines 450, 450') upon operatively coupling the memory module 402, 402' to the computer system. In certain embodiments, these data transmission circuits 416, 416' can be referred to as "load-reducing circuits" or "load-reducing switching circuits." As used herein, the terms "load-reducing" or "load-reducing switching" refer to the use of the data transmission circuits 416, 416' to reduce the load seen by the system memory controller 420, 420' when operatively coupled to the memory module 402, 402'. In certain embodiments, as schematically illustrated by FIG. 3A, the memory module 402 comprises n data transmission circuits 416, where n is the number of memory devices per rank of the memory module 410. For example, as schematically shown in FIG. 3A, the memory devices 412 of the memory module 410 are arranged in four ranks of n memory devices each, and the memory module 410 comprises at least a first data transmission circuit $416_1$ and a second data transmission circuit $416_2$. The first data transmission circuit $416_1$ of certain such embodiments is operatively coupled to at least one memory device 412 of each rank (e.g., memory devices $412A_1, 412B_1, 412C_1, 412D_1$). The second data transmission circuit $416_2$ of certain such embodiments is operatively coupled to at least one memory device 412 of each rank (e.g., memory devices $412A_2, 412B_2, 412C_2, 412D_2$). In certain embodiments, as schematically illustrated by FIG. 3B, the memory module 402' comprises n/2 data transmission circuits 416', where n is the number of memory devices per rank of the memory module 410'. For example, as schematically shown in FIG. 3B, the memory devices 412' of the memory module 410' are arranged in four ranks of n memory devices each, and the memory module 410' comprises at least a first data transmission circuit 416'$_1$ and a second data transmission circuit 416'$_2$. The first data transmission circuit 416'$_1$ of certain such embodiments is operatively coupled to at least two memory devices 412' of each rank (e.g., memory devices 412'A$_1$, 412'A$_2$, 412'B$_1$, 412'B$_2$, 412'C$_1$, 412'C$_2$, 412'D$_1$, 412'D$_2$). The second data transmission circuit 416'$_2$ of certain such embodiments is operatively coupled to at least two memory devices 412' of each rank (e.g., memory devices 412'A$_3$, 412'A$_4$, 412'B$_3$, 412'B$_4$, 412'C$_3$, 412'C$_4$, 412'D$_3$, 412'D$_4$).

In certain embodiments, at least one data transmission circuit 416, 416' selectively switches between two or more memory devices 412, 412' so as to operatively couple at least one selected memory device 412, 412' to the system memory controller 420, 420' (e.g., the data transmission circuit 416, 416' is configurable to respond to module control signals by selectively allowing or inhibiting data transmission between the system memory controller 420, 420' and at least one selected memory device 412, 412'). In certain such embodiments, the at least one data transmission circuit 416, 416' selectively operatively couples two selected memory devices to the system memory controller 420, 420'. For example, as schematically shown in FIG. 3A, the first data transmission circuit 416$_1$ is configurable to respond to module control signals by selectively allowing or inhibiting data transmission between the system memory controller 420 and either selected memory devices 412A$_1$ and 412C$_1$ or selected memory devices 412B$_1$ and 412D$_1$), and the second data transmission circuit 416$_2$ is configurable to respond to module control signals by selectively allowing or inhibiting data transmission between the system memory controller 420 and either selected memory devices 412A$_2$ and 412C$_2$ or selected memory devices 412B$_2$ and 412D$_2$). Conversely, in a conventional memory module without the data transmission circuits 416, the two or more memory devices 412 (e.g., memory devices 412A$_1$, 412B$_1$, 412C$_1$, 412D$_1$) are concurrently operatively coupled to the system memory controller 420. A data transmission circuit 416 of certain embodiments bidirectionally buffer data signals between the memory controller 420 and the memory devices 412 corresponding to the data transmission circuit 416. For another example, as schematically shown in FIG. 3B, the first data transmission circuit 416'$_1$ is configurable to respond to module control signals by selectively allowing or inhibiting data transmission between the system memory controller 420' and either selected memory devices 412'A$_1$ and 412'C$_1$ or selected memory devices 412'B$_1$ and 412'D$_1$ and either selected memory devices 412'A$_2$ and 412'C$_2$ or selected memory devices 412'B$_2$ and 412'D$_2$), and the second data transmission circuit 416'$_2$ is configurable to respond to module control signals by selectively allowing or inhibiting data transmission between the system memory controller 420' and either selected memory devices 412'A$_3$ and 412'C$_3$ or selected memory devices 412'B$_3$ and 412'D$_3$ and either selected memory devices 412'A$_4$ and 412'C$_4$ or selected memory devices 412'B$_4$ and 412'D$_4$).

In certain embodiments, two or more of the data transmission circuits 416, 416' are mechanically coupled to the at least PCB 410, 410' at corresponding positions which are separate from one another. For example, as schematically illustrated by FIG. 3A, the first data transmission circuit 416$_1$ and the second data transmission circuit 416$_2$ are at corresponding positions which are separate from one another (e.g., the package containing the first data transmission circuit 416$_1$ is at a location spaced from the location of the package containing the second data transmission circuit 416$_2$). For another example, as schematically illustrated by FIG. 3B, the first data transmission circuit 416'$_1$ and the second data transmission circuit 416'$_2$ are at corresponding positions which are separate from one another (e.g., the package containing the first data transmission circuit 416'$_1$ is at a location spaced from the location of the package containing the second data transmission circuit 416'$_2$). In certain such embodiments, two or more of the data transmission circuits 416, 416' are distributed across a surface of the PCB 410, 410' of the memory module 402, 402'. In certain embodiments, the corresponding positions of two or more data transmission circuits 416, 416' (e.g., first data transmission circuit 416$_1$ and second data transmission circuit 416$_2$ of FIG. 3A or first data transmission circuit 416'$_1$ and second data transmission circuit 416'$_2$ of FIG. 3B) are along an edge 411, 411' of the at least one PCB 410, 410' such that a data transmission circuit 416, 416' is located substantially between the edge 411, 411' and at least some of the at least two memory devices 412, 412' to which the data transmission circuit 416, 416' is operatively coupled. For example, as schematically illustrated by FIG. 3A, the first data transmission circuit 416$_1$ is located substantially between the edge 411 and the memory devices 412A$_1$, 412B$_1$, 412C$_1$, 412D$_1$ to which the first data transmission circuit 416$_1$ is operatively coupled, and the second data transmission circuit 416$_2$ is located substantially between the edge 411 and the memory devices 412A$_2$, 412B$_2$, 412C$_2$, 412D$_2$ to which the second data transmission circuit 416$_1$ is operatively coupled. For another example, as schematically illustrated by FIG. 3B, the first data transmission circuit 416'$_1$ is located substantially between the edge 411' and the memory devices 412'A$_1$, 412'A$_2$, 412'B$_1$, 412'B$_2$, 412'C$_1$, 412'C$_2$, 412'D$_1$, 412'D$_2$ to which the first data transmission circuit 416'$_1$ is operatively coupled, and the second data transmission circuit 416'$_2$ is located substantially between the edge 411' and the memory devices 412'A$_3$, 412'A$_4$ 412'B$_3$, 412'B$_4$, 412'C$_3$, 412'C$_4$, 412'D$_3$, 412'D$_4$ to which the second data transmission circuit 416'$_2$ is operatively coupled.

FIGS. 3C and 3D illustrate the positioning of the data transmission circuits 416' in accordance with certain embodiments described herein. In certain embodiments, the position of at least one of the data transmission circuits 416' is generally aligned with one or more of the memory devices 412' to which the data transmission circuit 416' is operatively coupled. For example, the one or more of the data transmission circuits 416' and the memory devices 412' to which it is operatively coupled can be positioned generally along a line that is substantially perpendicular to the edge 411' of the PCB 410'. In certain embodiments, the position of at least one of the data transmission circuits 416' is generally offset from a line defined by the positions of the one or more of the memory devices 412' to which the data transmission circuit 416' is operatively coupled. For example, as shown in FIGS. 3C and 3D, the memory devices 412' operatively coupled to a data transmission circuit 416' can be positioned along a line that is substantially perpendicular to the edge 411' of the PCB 410' and the data transmission circuit 416' can be generally offset from this line in a direction generally along the edge 411' of the PCB 410'. In certain such embodiments, the data transmission circuits 416' are sufficiently small in width and breadth (e.g., 2.5 mm by 7.5 mm) to fit between the edge 411' and the corresponding memory devices 412' while maintaining the desired size of the memory module 400'. Other positions and sizes of the separate data transmission circuits 416' are also compatible with certain embodiments described herein. For example, in certain embodiments, one or more of the data transmission circuits 416, 416' can be positioned between two or more memory devices 412, 412', or can be spaced away from an edge 411, 411' of the PCB 410, 410' with one or more memory devices 412, 412' between the edge 411, 411' and the one or more data transmission circuits 416, 416'.

Figure 4A:
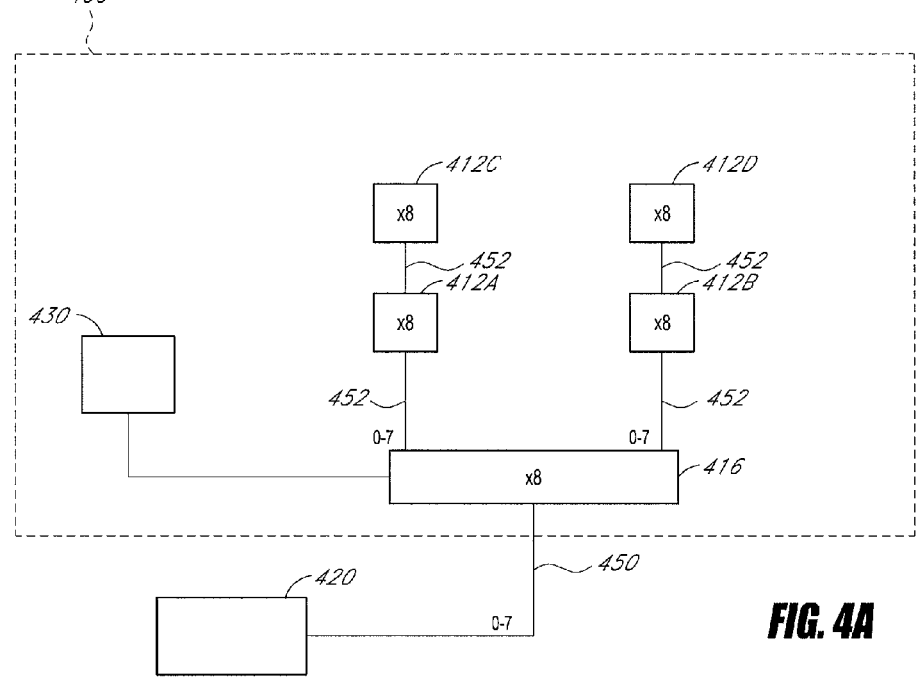
FIG. 4A schematically illustrates an example memory subsystem comprising a data transmission circuit with a bit width which is the same as that of the individual memory devices.

In certain embodiments, the data transmission circuit 416 comprises or functions as a byte-wise buffer. In certain such embodiments, each of the one or more data transmission circuits 416 has the same bit width as does the associated memory devices 412 per rank to which the data transmission circuit 416 is operatively coupled. For example, as schematically illustrated by FIG. 4A (which corresponds generally to FIG. 3A), the data transmission circuit 416 can be operatively coupled to a single memory device 412 per rank, and both the data transmission circuit 416 and the memory device 412 per rank to which the data transmission circuit 416 is operatively coupled can each have the same bit width (e.g., 4 bits, 8 bits, or 16 bits). The data transmission circuit 416 of FIG. 4A has a bit width of 8 bits, and receives data bits 0-7 from the system memory controller 420 and selectively transmits the data bits 0-7 to selected memory devices 412A, 412B, 412C, 412D in response to the module control signals from the control circuit 430. Similarly, data transmission circuits 416' of certain embodiments can function as a byte-wise buffer for associated memory devices 412'A, 412'B, 412'C, 412'D to which the data transmission circuits 416' are operatively coupled in response to the module control signals from the control circuit 430'.

Figure 4B:
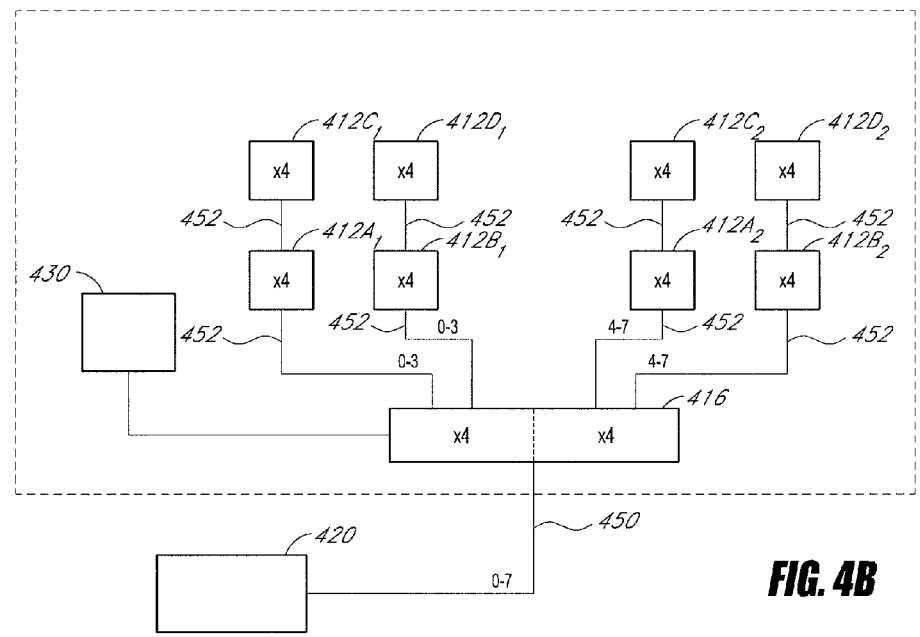
FIG. 4B schematically illustrates an example memory subsystem comprising a data transmission circuit with a bit width different from that as the individual memory devices.

In certain other embodiments, the bit widths of one or more of the memory devices 412 may be different from the bit widths of the one or more data transmission circuits 416 to which they are connected. For example, as schematically illustrated by FIG. 4B (which corresponds generally to FIG. 3B), the data transmission circuits 416 may have a first bit width (e.g., a bit width of 8 bits) and the memory devices 412 may have a second bit width which is less than the first bit width (e.g., one-half the first bit width, or a bit width of 4 bits), with each data transmission circuit 416 operatively coupled to multiple memory devices 412 per rank (e.g., two memory devices 412 in each rank). In certain such embodiments, the total bit width of the multiple memory devices 412 per rank connected to the circuit 416 equals the bit width of the circuit 416 (e.g., 4 bits, 8 bits, or 16 bits). The data transmission circuit 416 of FIG. 4B has a total bit width of 8 bits, and receives data bits 0-7 from the system memory controller 420 and selectively transmits data bits 0-3 to a first memory device $412A_1$, $412B_1$, $412C_1$, $412D_1$ and data bits 4-7 to a second memory device $412A_2$, $412B_2$, $412C_2$, $412D_2$ in response to the module control signals from the control circuit 430. Similarly, data transmission circuits 416' of certain embodiments can function with different bit widths than those of the associated memory devices $412'A_1$, $412'A_2$, $412'B_1$, $412'B_2$, $412'C_1$, $412'C_2$, $412'D_1$, $412'D_2$ to which the data transmission circuits 416' are operatively coupled in response to the module control signals from the control circuit 430'.

In certain embodiments, by having the data transmission circuit 416 comprise or serve as a "byte-wise" buffer (e.g., as shown in the examples of FIGS. 4A and 4B), the data signals are synchronous with the synch clock. In addition, for certain such embodiments in which the memory module 400 experiences variations in one or more characteristics (e.g., temperature, voltage, manufacturing parameters), the memory module 400 can be designed to optimize the circuits of a smaller number of components as compared to other configurations which do not utilize byte-wide buffering (e.g., having four ranks of 8-bit memory devices and having two 4-bit buffers). In certain embodiments, the data transmission circuits 416 are used for bit slicing in which the data are defined in sections. For example, rather than defining data to be 64-bit-wide (e.g., [63:0]), the data can be defined or sliced in 16-bit-wide sections (e.g., [15:0], [31:16], [47:32], [63:48]). In certain such embodiments, not all the bits are grouped together and not all the bits produce the same behavior (e.g., logic- and/or time-wise).

One or more of the data transmission circuits 416, in accordance with an embodiment of this disclosure, is operatively coupled to a corresponding one or more of the data lines 452 connected to one or more memory devices 412 in each of the ranks A, B, C, D. For example, in certain embodiments, each data transmission circuit 416 is connected to one or more data lines 452 connected to one corresponding memory device in each of the ranks (e.g., memory devices 204A, 204B, 204C, and 204D, as shown in FIG. 3A). Each data line 450, 452 thus carries data from the system memory controller 420, through the data transmission circuits 416, to the memory devices 204A, 204B, 204C, 204D connected to the data transmission circuits 416. The data transmission circuits 416 of certain embodiments may be used to drive each data bit to and from the memory controller 420 and the memory devices 412, instead of the memory controller 420 and the memory devices 412 directly driving each data bit to and from the memory controller 420 and the memory devices 412. Specifically, as described in more detail below, one side of each data transmission circuit 416 of certain embodiments is operatively coupled to a memory device 412 in each rank (e.g., via data lines 452), while the other side of the data transmission circuit 416 is operatively coupled to the corresponding data line 450 of the memory controller 420.

To reduce the memory device loads seen by the system memory controller 420 (e.g., during a write operation), the data transmission circuit 416 of certain embodiments is advantageously configured to be recognized by the system memory controller 420 as a single memory load. This advantageous result is desirably achieved in certain embodiments by using the data transmission circuits 416 to electrically couple only the enabled memory devices 412 to the memory controller 420 (e.g., the one, two, or more memory devices 412 to which data is to be written) and to electrically isolate the other memory devices 412 from the memory controller 420 (e.g., the one, two, or more memory devices 412 to which data is not to be written). Therefore, during a write operation in which data is to be written to a single memory device 412 in a rank of the memory module 400, each data bit from the system memory controller 420 sees a single load from the memory module 400, presented by one of the data transmission circuits 416, instead of concurrently seeing the loads of all of the four memory devices 412A, 412B, 412C, 412D to which the data transmission circuit 416 is operatively coupled. In the example of FIG. 3A, during a write operation in which data is to be written to two memory device 412 in two ranks (e.g., memory devices 412A and 412C or memory devices 412B and 412D), each data bit from the system memory controller 420 sees a single load from the memory module 402, which is presented by one of the data transmission circuits 416, instead of concurrently seeing the loads of all of the four memory devices 412A, 412B, 412C, 412D to which the data transmission circuits 416 is operatively coupled. In comparison to the standard JEDEC four-rank DIMM configuration (see FIG. 2A and FIG. 2B), the memory system 402 of certain embodiments may reduce the load on the system memory controller 420 by a factor of four.

Figure 5:
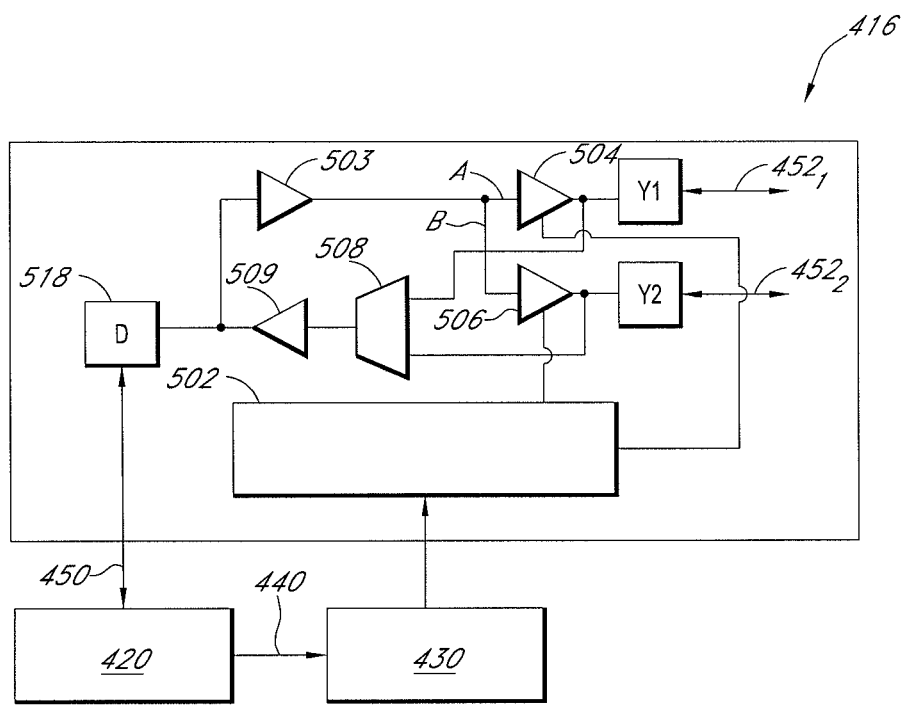
FIG. 5 is a schematic representation of an example embodiment of a data transmission circuit compatible with the memory subsystem of FIG. 3A.

FIG. 5 schematically illustrates an example data transmission circuit 416 compatible with certain embodiments described herein. In one embodiment, the data transmission circuits 416 includes control logic circuitry 502 used to control the various components of the data transmission circuit 416, which may include one or more buffers, one or more switches, and one or more multiplexers among other components. The illustrated embodiment of FIG. 5 is 1-bit wide and switches a single data line 518 between the memory controller 420 and the memory devices 412. In other embodiments, the data transmission circuit 416 may be multiple bits wide, for example, 8 bits, and switch a corresponding number of data lines 518. In a multiple bit wide embodiment, the control logic circuitry 502 may be shared over the multiple bits.

As a part of isolating the memory devices 412 from the system memory controller 420, in one embodiment, the data transmission circuits 416 allow for "driving" write data and "merging" read data. In the operational embodiment shown in FIG. 5, in a write operation, data entering a data transmission circuit 416 via a data line 518 is driven onto two data paths, labeled path A and path B, preferably after passing through a write buffer 503. The ranks of memory devices 412 are likewise divided into two groups with one group associated with path A and one group associated with path B. As shown in FIG. 3A, rank A and rank C are in the first group, and rank B and rank D are in the second group. Accordingly, the memory devices 412A, 412C of rank A and rank C are connected to the data transmission circuits 416 by a first one of the two data paths, and the memory devices 412B, 412D of rank B and rank D are connected to the data transmission circuits 416 by a second one of the two data paths. In other embodiments, the driving of write data and merging of read data may be performed over more than two data paths.

As is known, Column Address Strobe (CAS) latency is a delay time which elapses between the moment the memory controller 420 informs the memory modules 402 to access a particular column in a selected rank or row and the moment the data for or from the particular column is on the output pins of the selected rank or row. The latency may be used by the memory module to control operation of the data transmission circuits 416. During the latency, address and control signals pass from the memory controller 420 to the control circuit 430 which produces controls sent to the control logic circuitry 502 (e.g., via lines 432) which then controls operation of the components of the data transmission circuits 416.

For a write operation, during the CAS latency, the control circuit 430, in one embodiment, provides enable control signals to the control logic circuitry 502 of each data transmission circuit 416, whereby the control logic circuitry 502 selects either path A or path B to direct the data. Accordingly, when the control logic circuitry 502 receives, for example, an "enable A" signal, a first tristate buffer 504 in path A is enabled and actively drives the data value on its output, while a second tristate buffer 506 in path B is disabled with its output in a high impedance condition. In this state, the data transmission circuit 416 allows the data to be directed along path A to a first terminal Y1, which is connected to and communicates only with the first group of the memory devices 412, e.g., those in ranks A and C. Similarly, if an "enable B" signal is received, the first tristate 504 opens path A and the second tristate 506 closes path B, thus directing the data to a second terminal Y2, which is connected to and communicates only with the second group of the memory devices 412, e.g., those in ranks B and D.

For a read operation, the data transmission circuit 416 operates as a multiplexing circuit. In the illustrated embodiment of FIG. 5, for example, data signals read from the memory devices 412 of a rank are received at the first or second terminals Y1, Y2 of the data transmission circuit 416. The data signals are fed to a multiplexer 508, which selects one to route to its output. The control logic circuitry 502 generates a select signal to select the appropriate data signal, and the selected data signal is transmitted to the system memory controller 420 along a single data line 518, preferably after passing through a read buffer 509. The read buffer 509 may be a tristate buffer that is enabled by the control logic circuitry 502 during read operations. In another embodiment, the multiplexer 508 and the read buffer 509 may be combined in one component. In yet another embodiment, the multiplexer 508 and the read buffer 509 operations may be split over two tristate buffers, one to enable the value from Y1 to the data line 518 and another to enable the value from Y2 to the data line 518.

The data transmission circuits 416 present a load on the data lines 518 from the write buffer 503 and the read buffer 509. The write buffer 503 is comparable to an input buffer on one of the memory devices 412, and the read buffer 509 is comparable to an output buffer on one of the memory devices 412. Therefore, the data transmission circuits 416 present a load to the memory controller 420 that is substantially the same as the load that one of the memory devices 412 would present. Similarly, the data transmission circuits 416 present a load on the first and second terminals Y1, Y2 from the multiplexer 508 and the first tristate buffer 504 (on the first terminal Y1) and the second tristate buffer 506 (on the second terminal Y2). The multiplexer 508 is comparable in loading to an input buffer on the memory controller 420, and the first and second tristate buffers 504, 506 are each comparable to an output buffer on the memory controller 420. Therefore, the data transmission circuits 416 present a load to the memory devices 412 that is substantially the same as the load that the memory controller 420 would present.

Additionally, the data transmission circuits 416 operate to ameliorate quality of the data signals passing between the memory controller 420 and the memory devices 412. Without the data transmission circuits 416, waveforms of data signals may be substantially degraded or distorted from a desired shape between source and sink. For example, signal quality may be degraded by lossy transmission line characteristics, mismatch between characteristics of transmission line segments, signal crosstalk, or electrical noise. However, in the read direction, the read buffer 509 regenerates the signals from the memory devices 412 thereby restoring the desired signal waveform shapes. Similarly, in the write direction, the first tristate buffer 504 and the second tristate buffer 506 regenerate the signals from the memory controller 420 thereby restoring the desired signal waveform shapes.

Referring again to FIG. 3A, when the memory controller 420 executes read or write operations, each specific operation is targeted to a specific one of the ranks A, B, C, and D of a specific memory module 402. The data transmission circuit 416 on the specifically targeted one of the memory modules 402 functions as a bidirectional repeater/multiplexor, such that it drives the data signal when connecting from the system memory controller 420 to the memory devices 412. The other data transmission circuits 416 on the remaining memory modules 402 are disabled for the specific operation. For example, the data signal entering on data line 518 entering into data transmission circuit 416 is driven to memory devices 412A and 412C or 412B and 412C depending on which memory devices are active and enabled. The data transmission circuit 416 then multiplexes the signal from the memory devices 412A, 412B, 412C, 412D to the system memory controller 420. The data transmission circuits 416 may each control, for example, a nibble-wide data path or a byte-wide-data path. As discussed above, the data transmission circuits 416 associated with each module 402 are operable to merge data read signals and to drive data write signals, enabling the proper data paths between the system memory controller 420 and the targeted or selected memory devices 412. Thus, the memory controller 420, when there are four four-rank memory modules, sees four load-reducing switching circuit loads, instead of sixteen memory device loads. The reduced load on the memory controller 420 enhances the performance and reduces the power requirements of the memory system, as compared with, for example, the conventional systems described above with reference to FIGS. 1A, 1B and 2A-2D.

Figure 6:
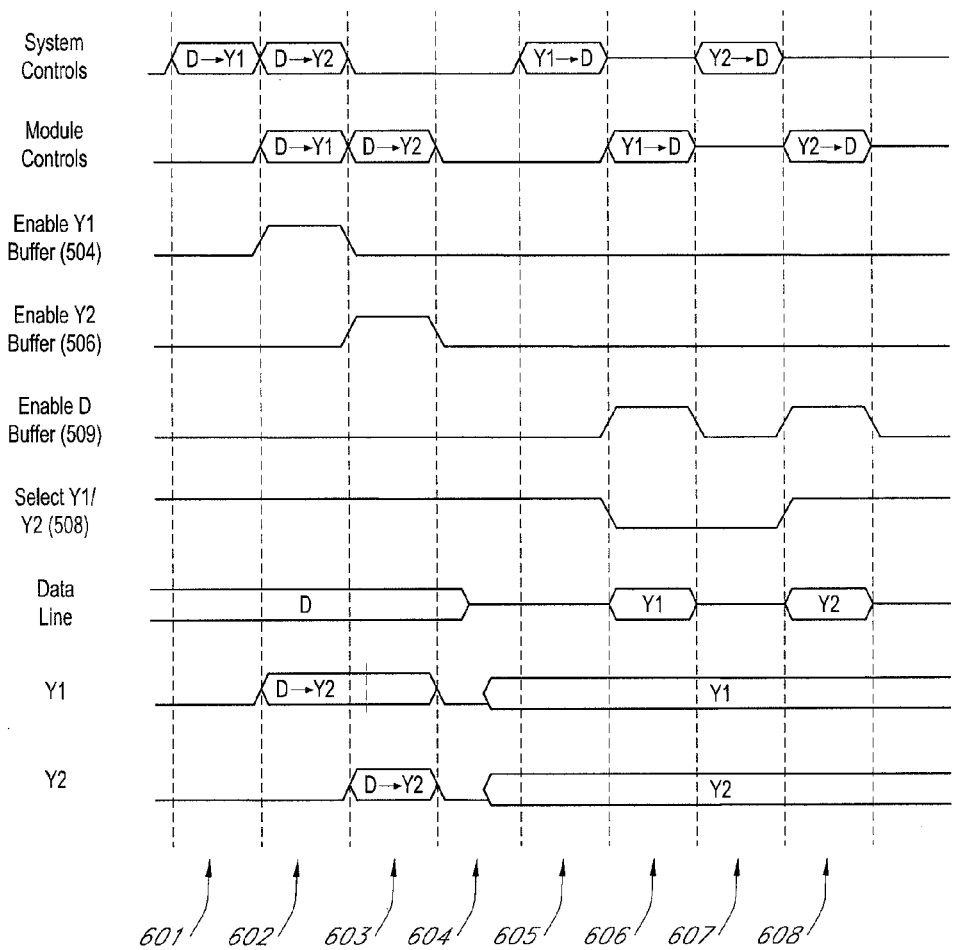
FIG. 6 is an example timing diagram illustrating operation of the memory system of FIGS. 3A and 5.

Operation of a memory module using the data transmission circuit 416 may be further understood with reference to FIG. 6, an illustrative timing diagram of signals of the memory module 402. The timing diagram includes first through eighth time periods 601-608. When the memory devices 404 are synchronous memories, each of the time periods 601-608 may correspond to one clock cycle of the memory devices 404.

The first, second, and third time periods 601-603 illustrate write operations with data passing from the memory controller 401 to the memory module 402. The fourth time period 604 is a transition between the write operations and subsequent read operations. The timing diagram shows a write operation to the first group of memory devices 412A, 412C connected to the first terminals Y1 of the data transmission circuits 416 and a write operation to the second group of memory devices 412B, 412D connected to the second terminals Y2 of the data transmission circuits 416. Recalling the CAS latency described above, each write operation extends over two time periods in a pipelined manner.

The write to the first group of memory devices 412A, 412C appears in the first time period 601 when system address and control signals 440 pass from the memory controller 420 to the module controller 430. The control circuit 430 evaluates the address and control signals 440 to determine that data is to be written to memory devices 412A, 412C in the first group. During the second time period 602, the control circuit 430 supplies control signals to the control logic circuitry 502 to enable the first tristate buffer 504 and to disable the second tristate buffer 506 and the read buffer 509. Thus, during the second time period 602, data bits pass from the data lines 518 to the first terminal Y1 and on to the memory devices 412A, 412C.

Similarly, the write to the second group of memory devices 412A, 412C appears in the second time period 602 when system address and control signals 440 pass from the memory controller 420 to the control circuit 430. The control circuit 430 evaluates the address and control signals 440 to determine that data is to be written to memory devices 412B, 412D in the second group. During the third time period 603, the control circuit 430 supplies control signals to the control logic circuitry 502 to enable the second tristate buffer 506 and to disable the first tristate buffer 504 and the read buffer 509. Thus, during the third time period 603, data bits pass from the data lines 518 to the second terminal Y2 and on to the memory devices 412B, 412D.

The fifth, sixth, seventh, and eighth time periods 605-608 illustrate read operations with data passing to the memory controller 420 from the memory module 402. The timing diagram shows a read operation from the first group of memory devices 412A, 412C connected to the first terminals Y1 of the data transmission circuits 416 and a read operation from the second group of memory devices 412B, 412D connected to the second terminals Y2 of the data transmission circuits 416. Recalling the CAS latency described above, each read operation extends over two time periods in a pipelined manner.

The read from the first group of memory devices 412A, 412C appears in the fifth time period 605 when system address and control signals 440 pass from the memory controller 420 to the control circuit 430. The control circuit 430 evaluates the address and control signals 440 to determine that data is to be read from memory devices 412A, 412C in the first group. During the sixth time period 606, the control circuit 430 supplies control signals to the control logic circuitry 502 to cause the multiplexer 58 to select data from the first terminal Y1, to enable the read buffer 509, and to disable the first tristate buffer 504 and the second tristate buffer 506. Thus, during the sixth time period 606, data bits pass from the memory devices 412A, 412C via the first terminal Y1 to data lines 518 and on to the memory controller 420.

The read from the second group of memory devices 412B, 412D appears in the seventh time period 607 when system address and control signals 440 pass from the memory controller 420 to the control circuit 430. The control circuit 430 evaluates the address and control signals 440 to determine that data is to be read from memory devices 412B, 412D in the second group. During the eighth time period 608, the control circuit 430 supplies control signals to the control logic circuitry 502 to cause the multiplexer 508 to select data from the second terminal Y2, to enable the read buffer 509, and to disable the first tristate buffer 504 and the second tristate buffer 506. Thus, during the eighth time period 606, data bits pass from the memory devices 412B, 412D via the second terminal Y2 to data lines 518 and on to the memory controller 420.

Various embodiments have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A memory module comprising:
a plurality of memory devices;
a controller configured to receive control information from a system memory controller and to produce module control signals; and
a plurality of circuits configured to receive the module control signals, each circuit of the plurality of circuits having a first bit width and operatively coupled to at least two corresponding memory devices of the plurality of memory devices, the at least two corresponding memory devices each having a second bit width smaller than the first bit width, each circuit of the plurality of circuits comprising at least one write buffer and at least one read buffer and configured to selectively allow data transmission between the system memory controller and at least one selected memory device of the at least two corresponding memory devices in response to the module control signals, and to selectively isolate at least one other memory device of the at least two corresponding memory devices from the system memory controller in response to the module control signals, wherein each circuit of the plurality of circuits is operable, in response to the module control signals, to actively drive write data from the system memory controller to the at least one selected memory device of the at least two corresponding memory devices through the at least one write buffer, and to receive and drive read data from the at least one selected memory device of the at least two corresponding memory devices to the system memory controller through the at least one read buffer, wherein the circuits of the plurality of circuits are distributed at corresponding positions separate from one another.

2. The memory module of claim 1, wherein the plurality of circuits is contained in a plurality of packages at locations spaced from one another.

3. The memory module of claim 2, wherein the plurality of memory devices, the controller, and the plurality of circuits are mechanically coupled to a printed circuit board having an edge, wherein the packages are positioned along the edge and between the edge and the plurality of memory devices.

4. The memory module of claim 1, wherein the at least one write buffer and the at least one read buffer comprise byte-wise buffers.

5. The memory module of claim 1, wherein the each circuit of the plurality of circuits comprises:
- a data terminal to be operatively coupled to the system memory controller;
- a first memory terminal coupled to a first group of the plurality of memory devices; and
- a second memory terminal coupled to a second group of the plurality of memory devices;
- a first write data path between the data terminal and the first memory terminal;
- a second write data path between the data terminal and the second memory terminal;
- a read data path between the data terminal and a selected one of the first and second memory terminals; and
- control logic circuitry to receive the module control signals from the controller and to enable one of the first write data path, the second write data path and the read data path in response to the module control signals;
- wherein the control logic circuitry further controls selection of the selected one of the first and second memory terminals in accordance with the module control signals.

6. The memory module of claim 5, wherein the read data path is coupled to the first and second memory terminals via a selection circuit, and wherein, during a read operation, the control logic circuitry generates a select signal to the selection circuit and an enable signal to the read data path, the select signal controlling the selection circuit to select one of the first and second memory terminals to connect to the read data path, and the enable signal enabling the read data path.

7. The memory module of claim 1, wherein the memory module is a dual in-line memory module.

8. The memory module of claim 1, wherein the plurality of memory devices comprise one or more synchronous dynamic random access memory devices.

9. The memory module of claim 1, further comprising control logic circuitry configured to receive the module control signals, and wherein at least one write buffer of each circuit of the plurality of circuits comprises at least one tristate buffer controlled by the control logic circuitry in accordance with the module control signals and the at least one read buffer of each circuit of the plurality of circuits comprises at least one tristate buffer controlled by the control logic circuitry in accordance with the module control signals.

10. The memory module of claim 1, wherein the controller is configured to control the plurality of circuits using a Column Access Strobe (CAS) latency parameter.

11. The memory module of claim 1, wherein the module control signals include first indication of a direction of data flow and second indication of whether a first group of the plurality of memory devices or a second group of the plurality of memory devices are being accessed.

12. The memory module of claim 1, further comprising module control signal lines extending across a substantial portion of the memory module, wherein the controller transmits the module control signals over the module control signal lines, and wherein the plurality of circuits are distributed along the module control signal lines and receive the module control signals via the module control signal lines.

13. A method of operating a memory module coupled to a computer system memory controller via a plurality of sets of data lines, the memory module including a plurality of sets of memory devices, each set of memory devices corresponding to a set of data lines, the method comprising:
- receiving address/control signals from the memory controller;
- generating first and second sets of module control signals based on the address/control signals;
- transmitting the first set of module control signals to the plurality of sets of memory devices;
- transmitting the second set of module control signals to a plurality of data transmission circuits distributed across the memory module, each respective data transmission circuit corresponding to a respective set of memory devices and coupled between the respective set of memory devices and a respective set of data lines, the respective data transmission circuit including write data paths, read data paths, and control logic circuitry controlling the write data paths and read data paths in accordance with the second set of module control signals; and
- during a write operation, using the control logic circuitry in the respective data transmission circuit to enable a selected subset of the write data paths in the respective data transmission circuit in response to the second set of module control signals such that write data associated with the write operation is driven from the respective set of data lines to a selected subset of at least one memory device in the respective set of memory devices.

14. The method of claim 13, wherein each data transmission circuit has a first bit width and each memory device in the respective set of memory devices has a second bit width smaller than the first bit width.

15. The method of claim 13, wherein each data path comprises at least one tristate buffer controlled by the control logic circuitry.

16. The method of claim 13, further comprising:
- during a read operation, using the control logic circuitry in the respective data transmission circuit to generate at least one enable signal and at least one select signal in accordance with the second module control signals, the at least one enable signal enabling the read data paths and the at least one select signal controlling selection between a first group of at least one memory device in the respective set of memory devices and a second group of at least one memory device in the respective set of memory devices to provide read data via the read data path.

17. The method of claim 13, further comprising controlling the plurality of data transmission circuits using a CAS latency parameter.

18. The method of claim 17, wherein the address/control signals are received during a first time period, and wherein the second set of module control signals are transmitted during a second time period, the second time period follows the first time period according to the CAS latency parameter.

19. The method of claim 13, wherein transmitting the second set of module control signals comprises transmitting the second set of module control signals over a set of module control signal lines extending across a substantial portion of the memory module, and wherein the plurality of data transmission circuits are distributed along the module control signal lines and receive the second set of module control signals via the module control signal lines.

* * * * *